(12) United States Patent
Altonen et al.

(10) Patent No.: US 7,641,491 B2
(45) Date of Patent: Jan. 5, 2010

(54) LOAD CONTROL DEVICE HAVING A FLEXIBLE CONNECTOR

(75) Inventors: Gregory Altonen, Easton, PA (US); Jeremy Nearhoof, Lansdale, PA (US); John M. DiMaggio, Souderton, PA (US); Bradley T. Hibshman, Allentown, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 0 days.

(21) Appl. No.: 12/105,667

(22) Filed: Apr. 18, 2008

(65) Prior Publication Data

US 2008/0258859 A1 Oct. 23, 2008

Related U.S. Application Data

(60) Provisional application No. 60/925,821, filed on Apr. 23, 2007.

(51) Int. Cl.
*H01R 13/64* (2006.01)
(52) U.S. Cl. ........................ 439/247; 439/131
(58) Field of Classification Search ................. 439/247, 439/131
See application file for complete search history.

(56) References Cited

U.S. PATENT DOCUMENTS

| | | | |
|---|---|---|---|
| 3,588,489 A | 6/1971 | Gaines | |
| 3,609,647 A | 9/1971 | Castellano | |
| 3,707,697 A | 12/1972 | Izumi | |
| 4,117,258 A | 9/1978 | Shanker | |
| 4,760,218 A | 7/1988 | Gutman | |
| 4,875,880 A | 10/1989 | Welch et al. | |
| 4,940,417 A | 7/1990 | Hyogo et al. | |
| 5,893,768 A * | 4/1999 | Gawron et al. | 439/248 |
| 6,000,959 A * | 12/1999 | Curtindale et al. | 439/247 |
| 6,057,982 A * | 5/2000 | Kloeppel | 360/97.01 |
| 6,159,030 A * | 12/2000 | Gawron et al. | 439/247 |

(Continued)

FOREIGN PATENT DOCUMENTS

DE 19847225 A1 4/2000

(Continued)

OTHER PUBLICATIONS

Lutron Electronics Co., Inc., Telume Incandescent/Halogen Dimmer Installation Instructions, May 29, 2002, 6 sheets.

(Continued)

*Primary Examiner*—Truc T Nguyen
(74) *Attorney, Agent, or Firm*—Mark E. Rose; Philip N. Smith

(57) ABSTRACT

A load control device has a modular assembly to allow for easy adjustment of the aesthetic and the color of the load control device after installation. The load control device comprises a user interface module and a base module. The user interface module includes an actuation member for receiving a user input and a visual display for providing feedback to the user. A connector of the base module is adapted to be coupled to a connector of the user interface module, such that the base module and the user interface module are electrically connected. The connector of the base module is adapted to move along a longitudinal axis and a lateral axis of the dimmer, such that the actuation member is easily aligned within an opening of a faceplate.

21 Claims, 21 Drawing Sheets

U.S. PATENT DOCUMENTS

| | | | |
|---|---|---|---|
| 6,283,773 B1 * | 9/2001 | Price et al. ................... | 439/131 |
| 6,309,248 B1 * | 10/2001 | King ........................... | 439/535 |
| 6,398,565 B1 * | 6/2002 | Johnson et al. ............. | 439/131 |
| 6,558,190 B1 | 5/2003 | Pierson, Jr. | |
| 7,213,932 B1 | 5/2007 | Savicki, Jr. | |
| 7,232,336 B1 | 6/2007 | Evans | |
| 7,273,392 B2 | 9/2007 | Fields | |
| 7,321,120 B1 | 1/2008 | Gorman et al. | |
| 7,332,683 B2 | 2/2008 | Gorman | |
| 7,400,239 B2 | 7/2008 | Kiko et al. | |
| 7,458,837 B2 * | 12/2008 | Mineo, Hiroyuki ......... | 439/248 |
| 2001/0029128 A1 | 10/2001 | Horiuchi et al. | |
| 2004/0206609 A1 | 10/2004 | Tilley | |
| 2005/0280598 A1 | 12/2005 | Webb et al. | |
| 2006/0065510 A1 | 3/2006 | Kiko et al. | |
| 2007/0037442 A1 | 2/2007 | Sullivan et al. | |
| 2007/0290628 A1 | 12/2007 | Altonen et al. | |
| 2007/0290874 A1 | 12/2007 | Nearhoof et al. | |
| 2007/0291010 A1 | 12/2007 | Altonen et al. | |
| 2008/0258644 A1 | 10/2008 | Altonen et al. | |

FOREIGN PATENT DOCUMENTS

| | | |
|---|---|---|
| DE | 10127997 B1 | 10/2002 |
| FR | 2806249 A1 | 9/2001 |

OTHER PUBLICATIONS

European Patent Office, International Search Report and Written Opinion for International Patent Application No. PCT/US2008/005160, Aug. 25, 2008, 11 pages.

European Patent Office, International Search Report and Written Opinion for International Patent Application No. PCT/US2008/005226, Oct. 6, 2008, 10 pages.

* cited by examiner

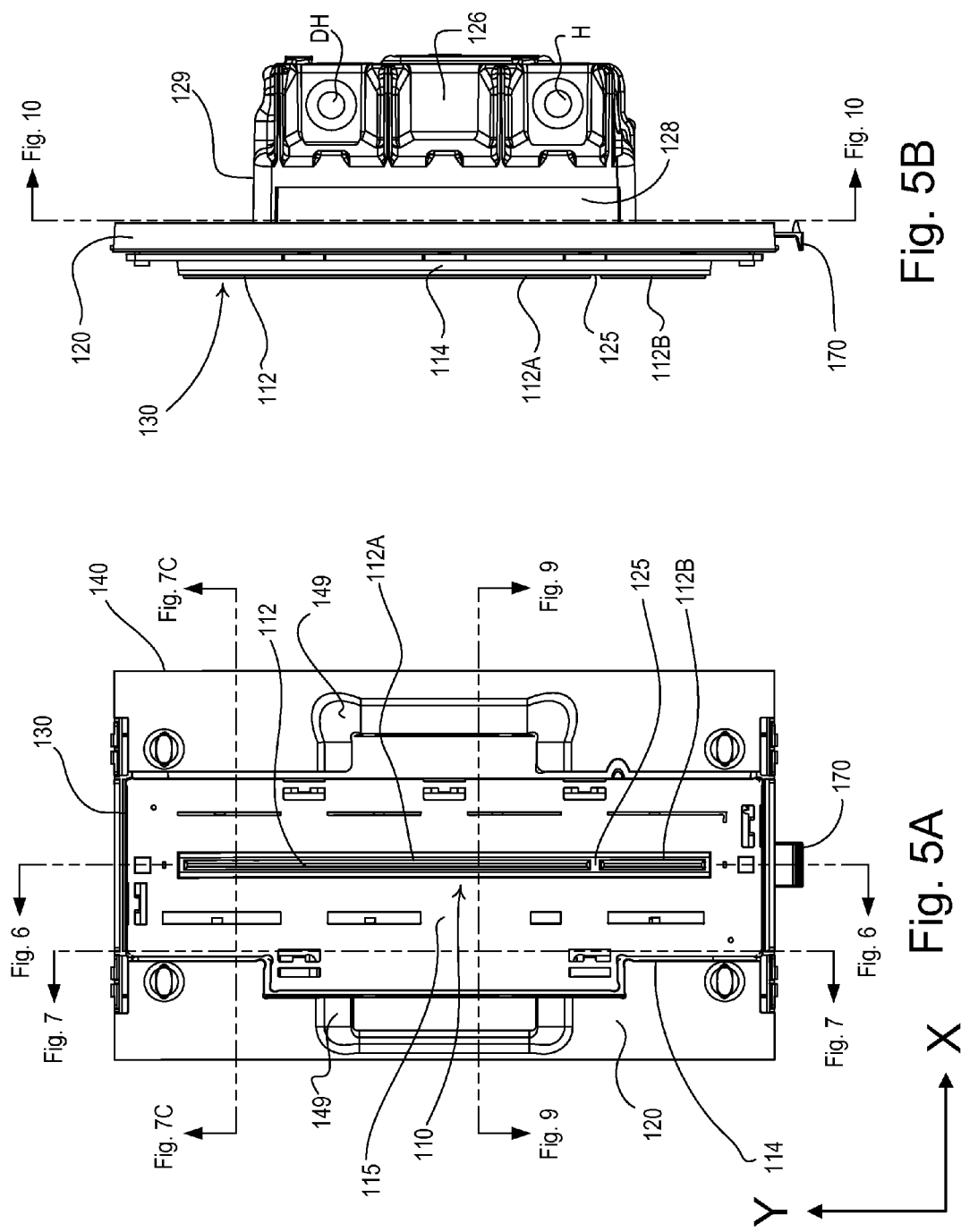

LOAD CONTROL DEVICE HAVING A FLEXIBLE CONNECTOR

RELATED APPLICATIONS

This application claims priority to commonly-assigned U.S. Provisional Application Ser. No. 60/925,821, filed Apr. 23, 2007, entitled LOAD CONTROL DEVICE HAVING A MODULAR ASSEMBLY, the entire disclosure of which is hereby incorporated by reference.

BACKGROUND OF THE INVENTION

1. Field of the Invention

The present invention relates to load control devices for controlling the amount of power delivered to an electrical load from a power source. More specifically, the present invention relates to a wall-mountable dimmer having a flexible connector allowing for easy installation of a user interface module and alignment of the user interface module in an opening of a faceplate.

2. Description of the Related Art

A conventional two-wire dimmer has two terminals: a "hot" terminal for connection to an alternating-current (AC) power supply and a "dimmed hot" terminal for connection to a lighting load. Standard dimmers use one or more semiconductor switches, such as triacs or field effect transistors (FETs), to control the current delivered to the lighting load and thus to control the intensity of the light. The semiconductor switches are typically coupled between the hot and dimmed hot terminals of the dimmer.

Smart wall-mounted dimmers include a user interface typically having a plurality of buttons for receiving inputs from a user and a plurality of visual indicators for providing feedback to the user. These smart dimmers typically include a microcontroller or other processing device for providing an advanced set of control features and feedback options to the end user. An example of a smart dimmer is described in greater detail in commonly assigned U.S. Pat. No. 5,248,919, issued on Sep. 28, 1993, entitled LIGHTING CONTROL DEVICE, the entire disclosure of which is hereby incorporated by reference.

FIG. 1 is a front view of a user interface of a prior art smart dimmer switch 10 for controlling the amount of power delivered from a source of AC power to a lighting load. As shown, the dimmer switch 10 includes a faceplate 12, a bezel 14, an intensity selection actuator 16 for selecting a desired level of light intensity of a lighting load (not shown) controlled by the dimmer switch 10, and a control switch actuator 18. Actuation of the upper portion 16A of the intensity selection actuator 16 increases or raises the light intensity of the lighting load, while actuation of the lower portion 16B of the intensity selection actuator 16 decreases or lowers the light intensity. The intensity selection actuator 16 may control a rocker switch, two separate push switches, or the like. The control switch actuator 18 may control a push switch or any other suitable type of actuator and typically provides tactile and auditory feedback to a user when pressed.

The smart dimmer 10 also includes an intensity level indicator in the form of a plurality of visual indicators 20, which are illuminated by a plurality of light sources such as light-emitting diodes (LEDs) located inside the dimmer 10. The visual indicators 20 may be arranged in an array (such as a linear array as shown) representative of a range of light intensity levels of the lighting load being controlled. The intensity level of the lighting load may range from a minimum intensity level, which is preferably the lowest visible intensity, but which may be zero, or "full off," to a maximum intensity level, which is typically "full on." Light intensity level is typically expressed as a percentage of full intensity. Thus, when the lighting load is on, light intensity level may range from 1% to 100%.

However, in order to change the color of the dimmer 10, specifically, the color of the bezel 14, the intensity selection actuator 16, and the control switch actuator 18, the dimmer must be replaced with another dimmer, which has the desired color. Since the LEDs that illuminate the visual indicators 20 are located inside the dimmer 10, the prior art dimmer is typically only offered having a single choice for the color of the visual indicators. The entire dimmer must be replaced to change the color of the LEDs.

Therefore there is a need for a load control device, which allows for easy adjustment of the color of the plastics of the user interface and the color of the visual indicators after the load control device is installed.

SUMMARY OF THE INVENTION

According to an embodiment of the present invention, at a load control device for controlling the amount of power delivered from an AC power source to an electrical load comprises a user interface module comprising a first connector, and a base module comprising a controllably conductive device adapted to be coupled in series electrical connection between the AC power source and the electrical load, a controller for controlling the controllably conductive device to control the amount of power delivered to the electrical load, and a second connector adapted to be coupled to the first connector of the user interface module. The base module further comprises a main printed circuit board having the controllably conductive device and the controller electrically connected thereto, a connector printed circuit board, the second connector mounted to the connector printed circuit board, and a cable electrically connecting the main printed circuit board and the connector printed circuit board. The second connector of the base module is adapted to move along both the longitudinal axis and the lateral axis of the load control device to allow for alignment of the user interface module on the base module.

According to another embodiment of the present invention, a load control device for controlling the amount of power delivered to an electrical load from an AC power source comprises a user interface module comprising a first connector, an actuator operable to receive a user input, and a visual display for displaying a representation of an amount of power being delivered to the electrical load. The load control device also comprises a base module having a controllably conductive device adapted to be coupled in series electrical connection between the AC power source and the electrical load, and a controller for controlling the controllably conductive device to control the amount of power delivered to the electrical load. The base module farther comprises a second connector adapted to be coupled to the first connector of the user interface module, such that the controller is responsive to the actuator and operatively coupled to the visual display when the first connector is coupled to the second connector. The second connector is adapted to move along both a longitudinal axis and a lateral axis of the load control device to align the user interface module on the base module.

In addition, a load control device comprising a user interface module, a base module, and a faceplate is described herein. The user interface module comprises a first connector and an actuator operable to receive a user input. The base module comprises a second connector adapted to be coupled to the first connector of the user interface module. The actuator of the user interface module is adapted to be provided in the opening of the faceplate. The second connector is adapted to move along at least one of a longitudinal axis and a lateral axis of the load control device to align the actuator of the user interface module within the opening of the faceplate. According to another embodiment of the present invention, the base module has a front surface defining a plane, and the second connector is adapted to move in a plane substantially parallel to the plane of the front surface to allow for alignment of the actuator of the user interface module within the opening of the faceplate.

Other features and advantages of the present invention will become apparent from the following description of the invention that refers to the accompanying drawings.

BRIEF DESCRIPTION OF THE DRAWINGS

FIG. 5A is a front view of the dimmer of FIG. 2 with the user interface module installed on the base module;

FIG. 5B is a right side view of the dimmer of FIG. 2 with the user interface module installed on the base module;

DETAILED DESCRIPTION OF THE INVENTION

Figure 1:
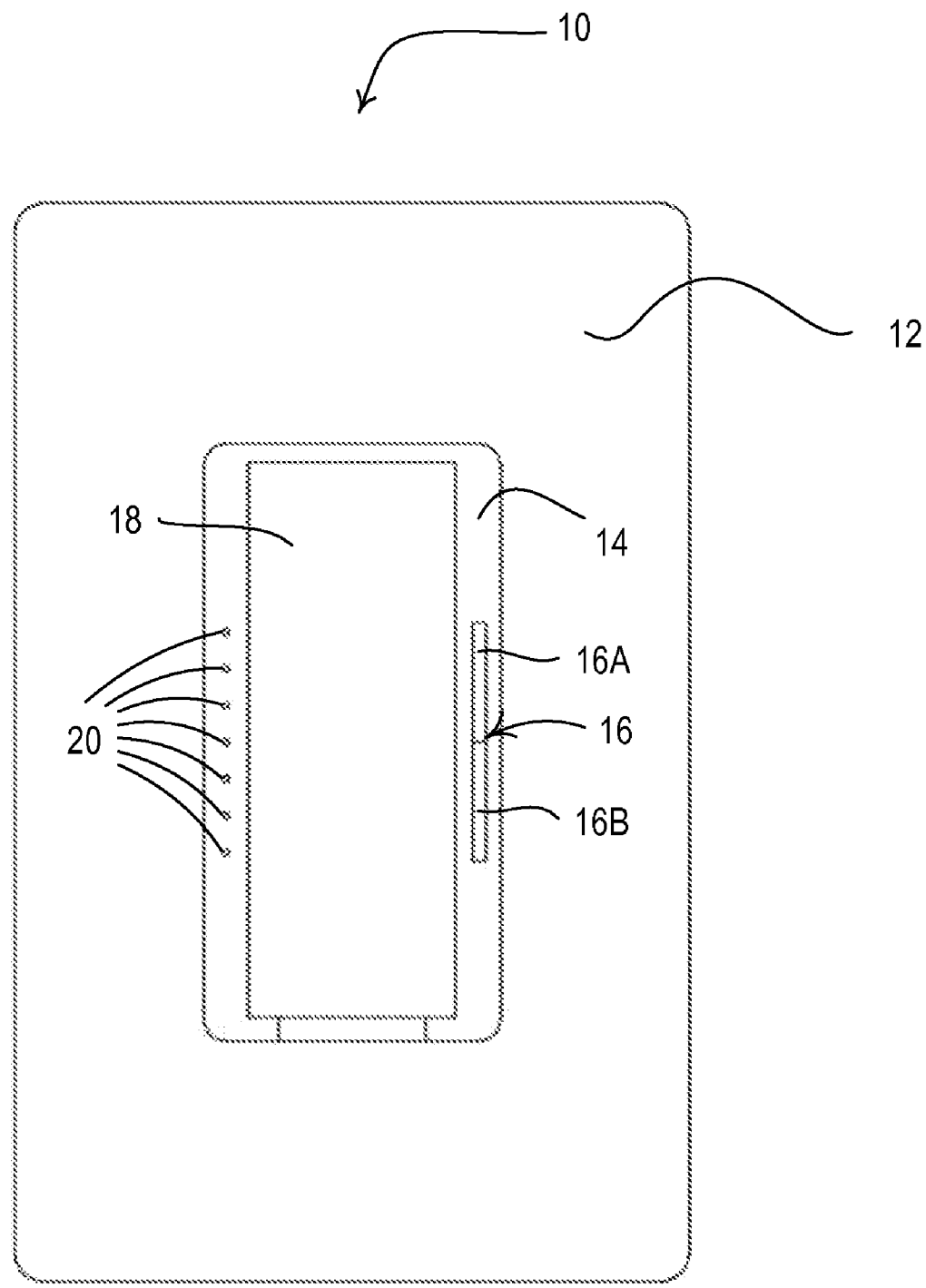
FIG. 1 is a front view of a user interface of a prior art dimmer.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

Figure 2:
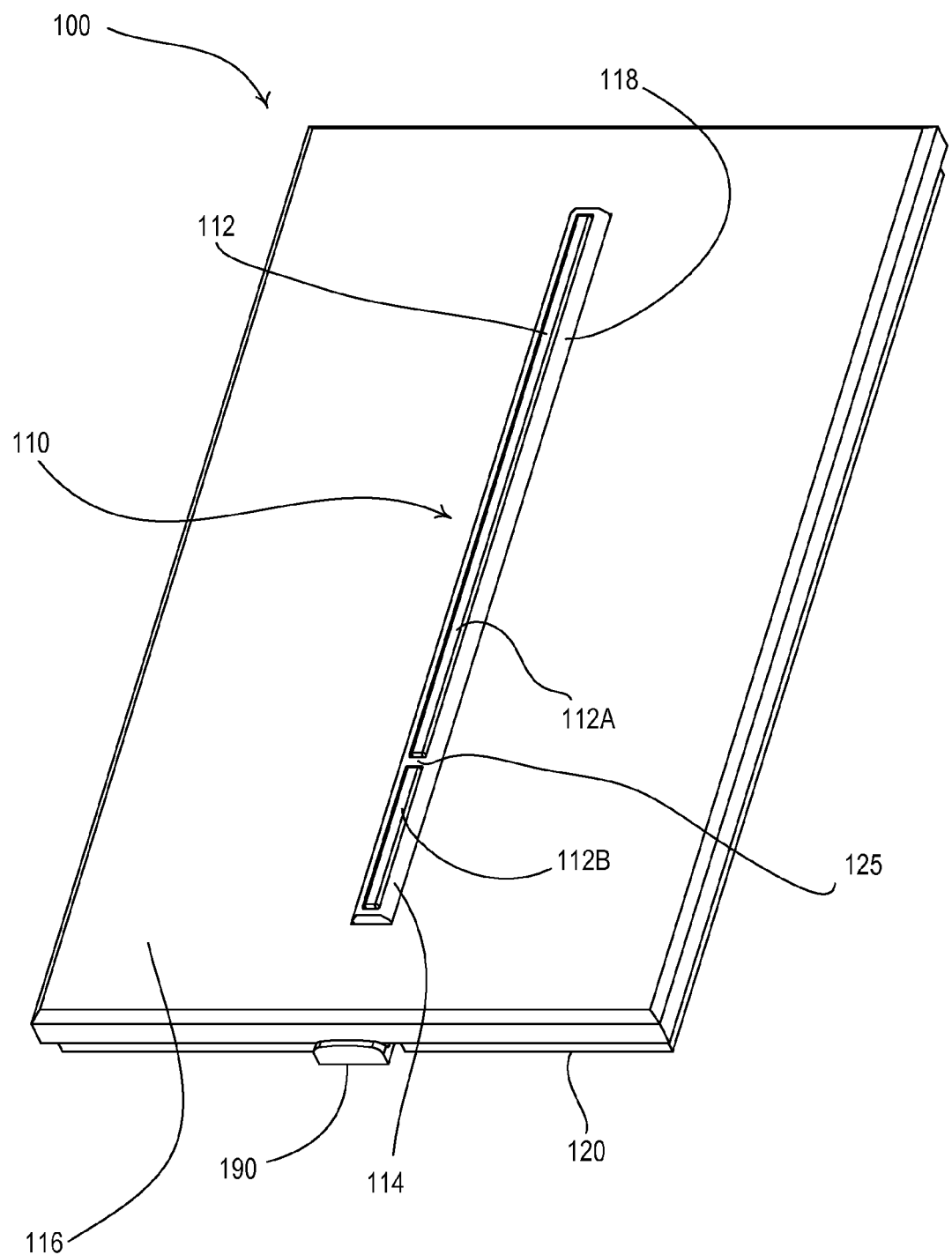
FIG. 2 is a perspective view of a dimmer according to the present invention.

FIG. 2 is a perspective view of a dimmer 100 according to the present invention. The dimmer 100 includes a thin touch sensitive actuator 110 comprising an actuation member 112 having first and second portions 112A, 112B. The actuation member 112 extends through a bezel 114 to contact a touch sensitive device 150 (FIG. 6) inside the dimmer 100 as will be described in greater detail below. The dimmer 100 is operable to control the intensity of a connected lighting load 208 (FIG. 12) in response to actuations of the actuation member 112 and thus the touch sensitive device 150.

Figure 3:
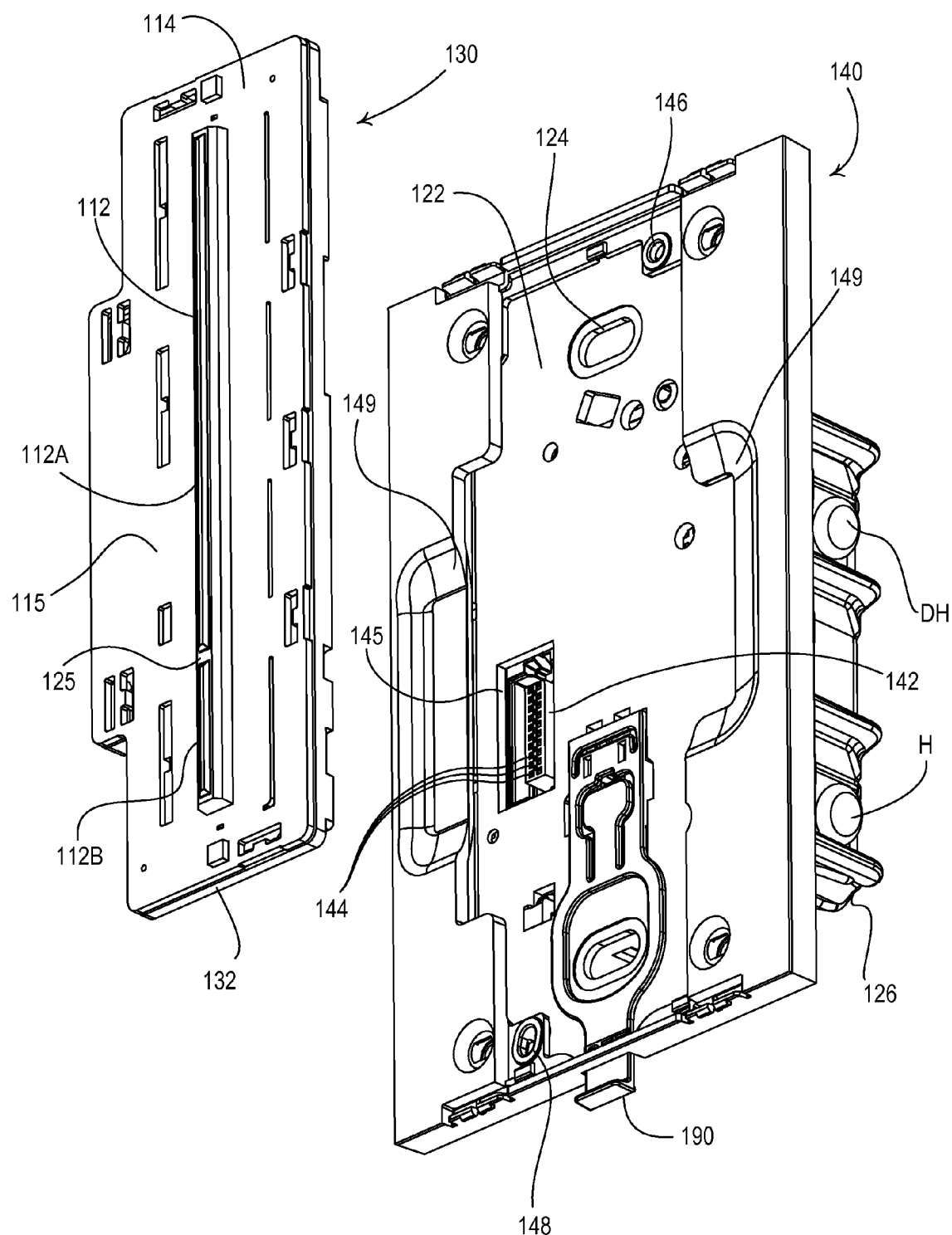
FIG. 3 is an exploded perspective view of the dimmer of FIG. 2 showing a user interface module and a base module.
Figure 6:
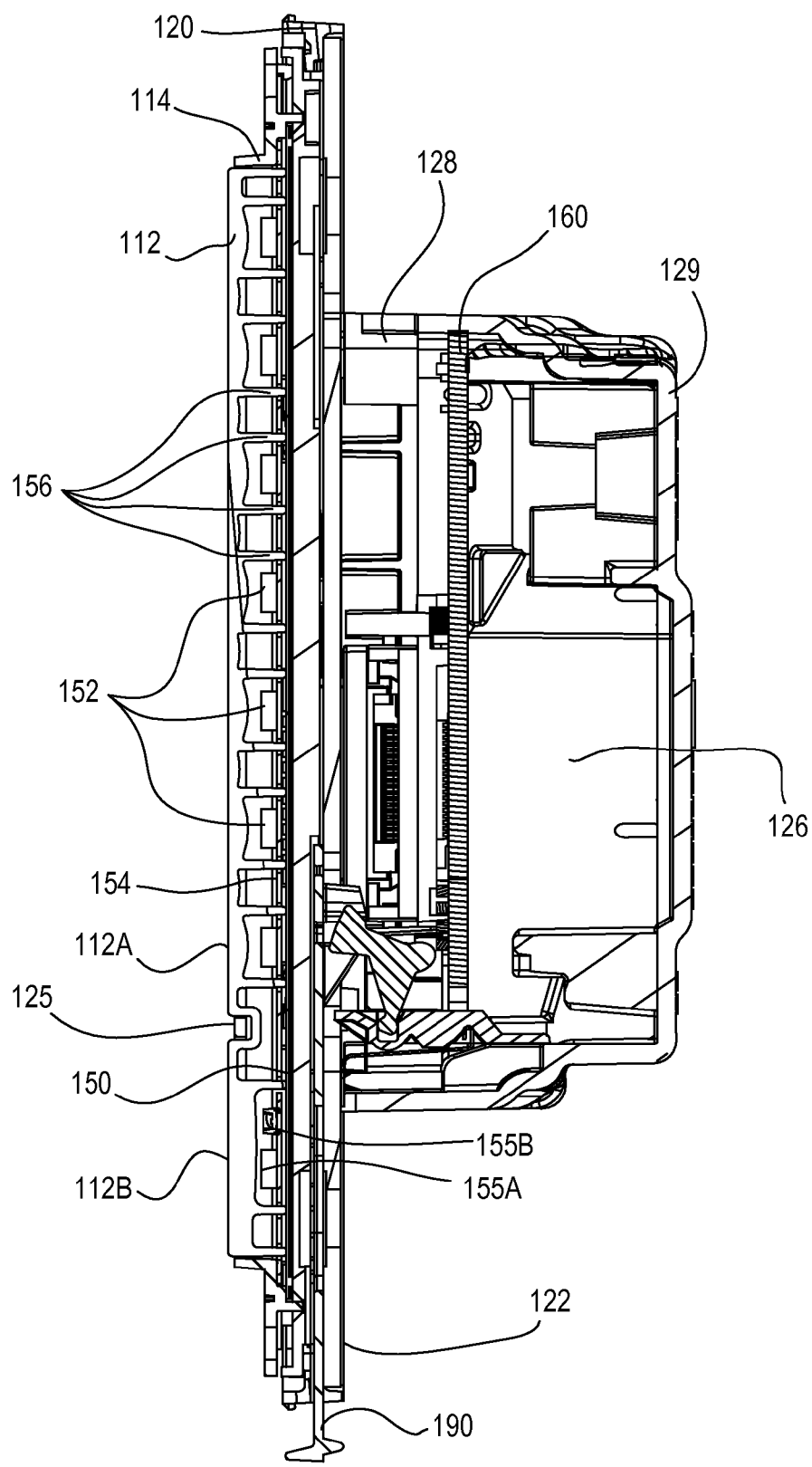
FIG. 6 is a right side cross-sectional view of the dimmer of FIG. 2.

The dimmer 100 further comprises a faceplate 116, which has a non-standard opening 118 and mounts to an adapter 120. The bezel 114 is housed behind the faceplate 116 and extends through the opening 118. The adapter 120 connects to a yoke 122 (FIG. 3), which is adapted to mount the dimmer 100 to a standard electrical wallbox via two mounting holes 124 (FIG. 3). The dimmer 100 further comprises an enclosure 126, which comprises a ring portion 128 and a back portion 129 (FIG. 6). An air-gap actuator 190 allows for actuation of an internal air-gap switch 219 (FIG. 12) by pulling the air-gap actuator down.

The bezel 114 comprises a break 125, which separates the upper portion 112A and the lower portion 112B of the actuation member 112. Upon actuation of the lower portion 112B of the actuation member 112, the dimmer 100 causes the connected lighting load 208 to toggle from on to off (and vice versa). Actuation of the upper portion 112A of the actuation member 112, i.e., above the break 125, causes the intensity of the lighting load 208 to change to a level dependent upon the position of the actuation along the length of the actuation member 112.

A plurality of visual indicators, e.g., a plurality of light-emitting diodes (LEDs) 152 (FIG. 6), are arranged in a linear array adjacent a rear surface of the actuation member 112. The actuation member 112 is substantially transparent, such that the LEDs 152 are operable to illuminate portions of a front surface of the actuation member. For example, two different color LEDs 152 may be located behind the lower portion 112B, such that the lower portion is illuminated with blue light when the lighting load 208 is on and with orange light with the lighting load is off. The LEDs 152 behind the upper portion 112A may be blue and illuminated, for example, as a bar graph to display the intensity of the lighting load 208 when the lighting load is on. The operation of the LEDs 152 is described in greater detail in U.S. patent application Ser. No. 11/472,246, filed Jun. 20, 2006, entitled LIGHTING CONTROL HAVING AN IDLE STATE WITH WAKE-UP UPON ACTUATION, the entire disclosure of which is hereby incorporated by reference.

Figure 4:
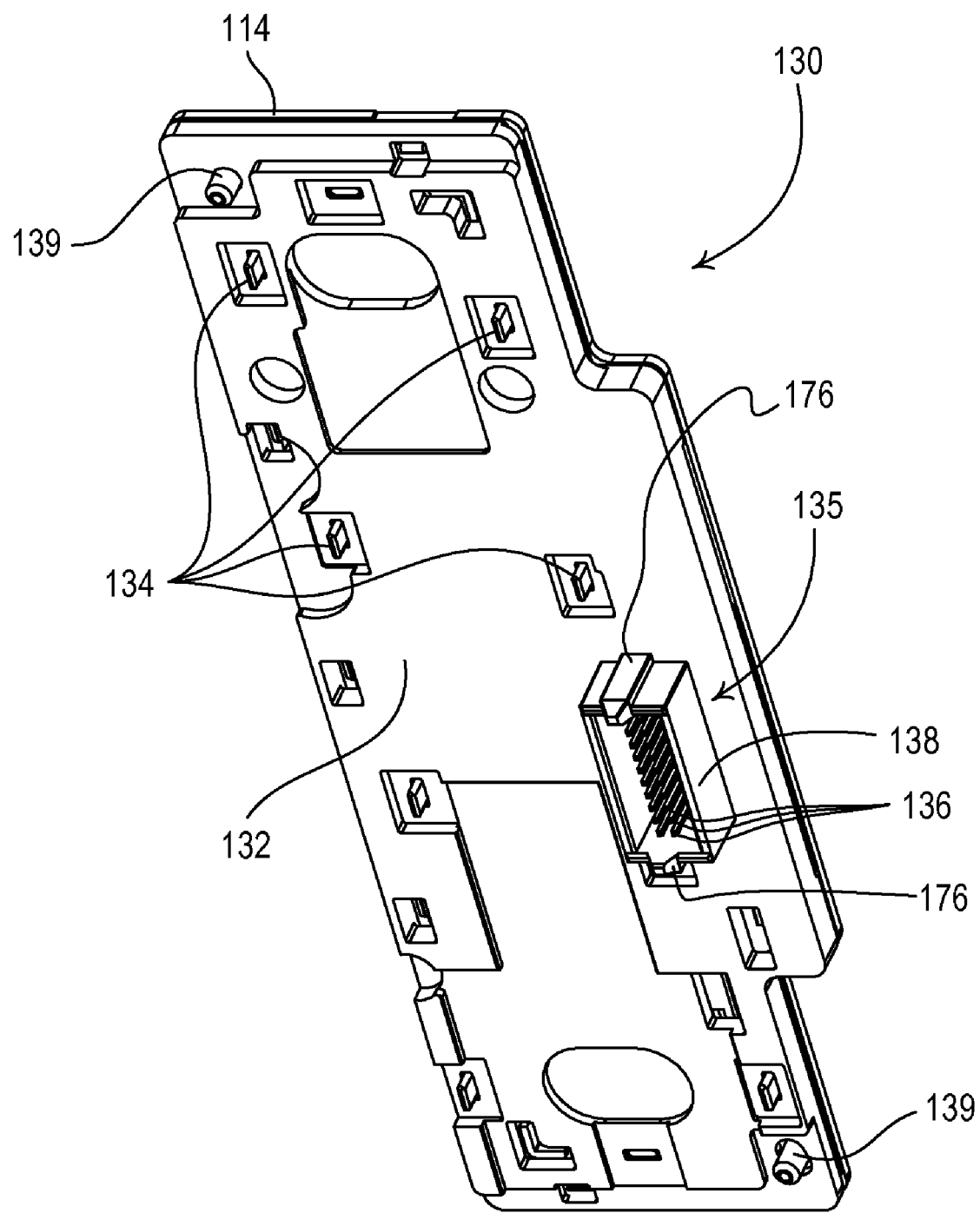
FIG. 4 is a rear perspective view of the user interface module of the dimmer of FIG. 2.

As described herein, the dimmer 100 has a modular assembly and comprises a user interface module 130 and a base module 140. FIG. 3 is an exploded perspective view of the dimmer 100 without the faceplate 116 shown. FIG. 4 is a rear perspective view of the user interface module 130. The touch sensitive device 150 and the LEDs 152 are included within the user interface module 130, while the base module 140 houses the load control circuitry of the dimmer 100, which will be described in greater detail with reference to FIG. 12.

The bezel 114 serves as a front enclosure portion of the user interface module 130 and defines a substantially flat front surface 115. The user interface module 130 includes a metal backplate 132, which serves as a rear enclosure portion of the user interface module and defines a substantially flat rear surface. The metal backplate 132 provides the user interface module 130 with a rigid structure. Alternatively, the backplate 132 could be made from a different rigid material, for example, Rynite® FRS43 resin, which is 43% glass reinforced polyethylene. A plurality of posts 134 may be heat-staked to attach the bezel 114 to the metal backplate 132. The user interface module 130 is adapted to be captured between the base module 140 and the faceplate 116 such that the touch sensitive actuator 110 is provided in the opening 118. Accordingly, the user interface module 130 does not attach to the base module 140 using screws or snaps.

The user interface module 130 includes a user interface module connector 135 operable to be coupled to a base module connector 142 of the base module 140. The user interface module connector 135 has a mating end, e.g., a plurality of pins 136, which are received by a mating end, e.g., a plurality of holes 144, of the base module connector 142 to provide a plurality of electrical connections (e.g., 20 connections) between the user interface module and the base module. The pins 136 are surrounded by walls 138, which are received in an opening 145 of the yoke 122.

The user interface module 130 further comprises two posts 139, which are received in openings 146, 148 in the adapter 120. The posts 139 assist in aligning the user interface module 130 during installation of the user interface module on the base module 140. The second opening 148 is slightly elongated to allow for adjustment of the user interface module 130 to ensure that the touch sensitive actuator 110 is aligned within the opening 118 of the faceplate 116. The adapter 120 further comprises two indentations 149, which allow the fingers of a user to grasp the user interface module 130 to remove (i.e., uninstall) the user interface module from the base module 140.

The user interface module 130 is cantilevered over the mounting holes 124 and thus the mounting screws (not shown) when the dimmer 100 is installed in an electrical wallbox. The periphery of the user interface module 130 extends beyond the periphery of the wallbox opening. Therefore, the touch sensitive actuator 110 extends beyond the periphery of the wallbox opening.

Figure 5C:
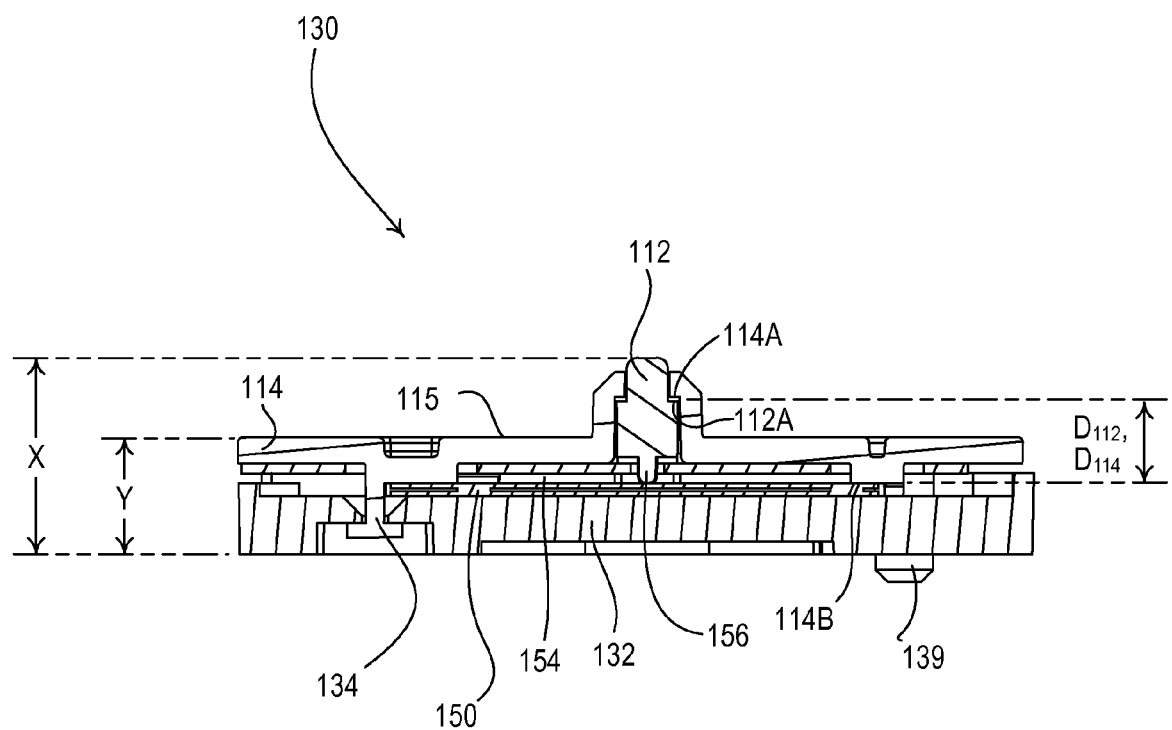
FIG. 5C is a bottom cross-sectional view of the user interface module.

FIG. 5A is a front view and FIG. 5B is a right side view of the dimmer 100 with the user interface module 130 installed on the base module 140, but without the faceplate 116 present. FIG. 5C is a bottom cross-sectional view of the user interface module 130 taken through one of the posts 134 as shown in FIG. 5A. FIG. 6 is a right side cross-sectional view of the dimmer 100 taken along the center-line of the dimmer 100.

Figure 7A:
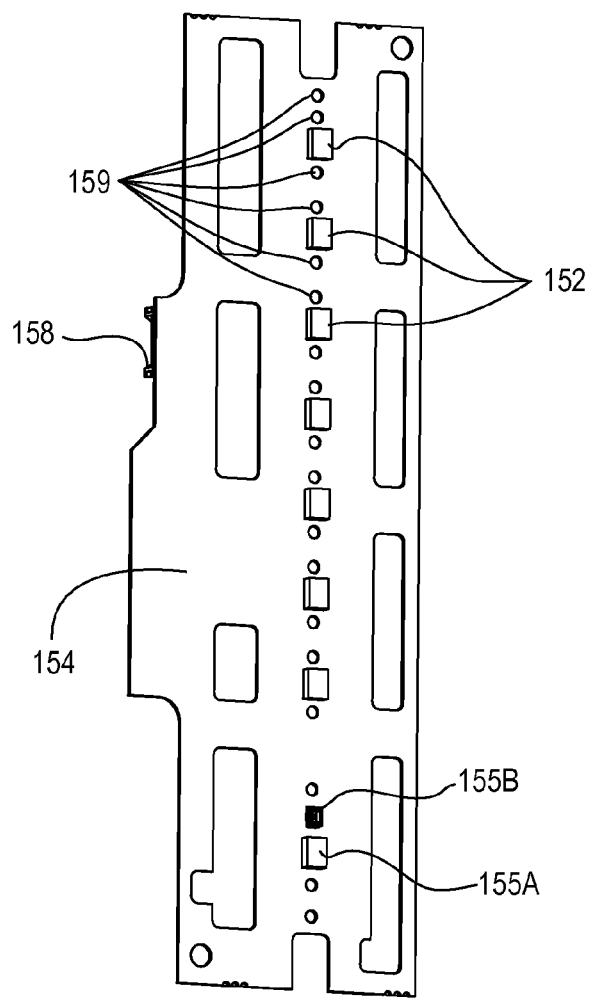
FIG. 7A is a front perspective view of a user interface module printed circuit board of the user interface module of FIG. 3.
Figure 7B:
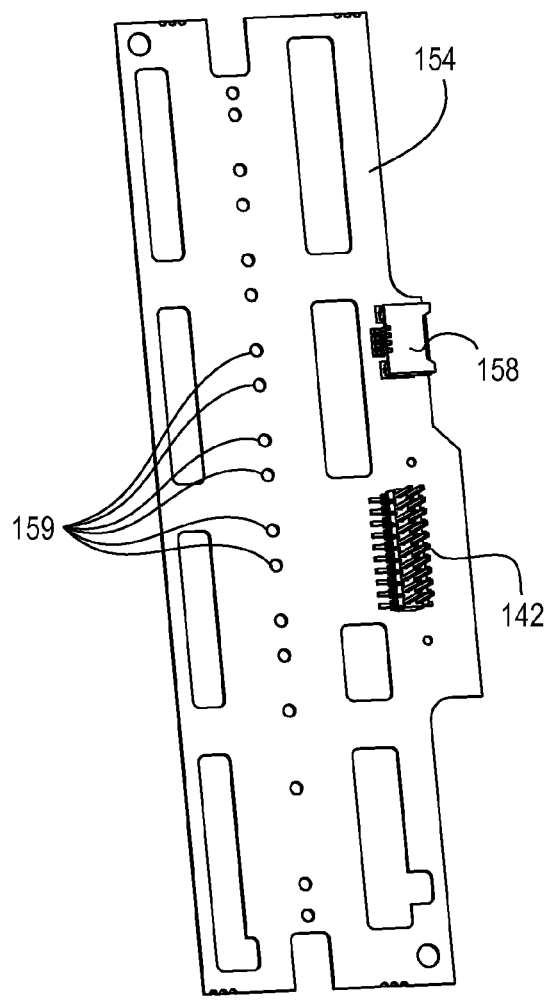
FIG. 7B is a rear perspective view of the user interface module printed circuit board of FIG. 7A.

As previously mentioned, the touch sensitive device 150 and the LEDs 152 are housed within the user interface module 130. Referring to FIG. 6, the LEDs 152 are mounted to a user interface module PCB 154 and are arranged in a linear array immediately behind the actuation member 112. FIGS. 7A and 7B are front and rear perspective views, respectively, of the user interface module PCB 154. A blue LED 155A and a orange LED 155B are mounted to the user interface PCB 154 behind the lower portion 112B of the actuation member 112 to alternately illuminate the lower portion blue and orange, respectively. Alternatively, other colors of LEDs 152 may be used.

The actuation member 112 includes a plurality of actuation posts 156, which contact the front surface of the touch sensitive device 150 and are arranged in a linear array along the length of the actuation member. The posts 156 act as force concentrators to concentrate the force from an actuation of the actuation member 112 to the touch sensitive device 150. The user interface module PCB 154 includes a plurality of holes 159, which the actuation posts 156 extend through to contact the touch sensitive device 150. Accordingly, the LEDs 152 are located above the touch sensitive device 150. The touch sensitive actuator 110 is described in greater detail in co-pending commonly-assigned U.S. patent application Ser. No. 11/471,908, filed Jun. 20, 2006, entitled TOUCH SCREEN ASSEMBLY FOR A LIGHTING CONTROL, the entire disclosure of which is hereby incorporated by reference.

The bezel 114 is clamped to the backplate 132 of the user interface module 130, such that the touch sensitive device 150 is sandwiched (i.e., compressed) between the bezel and the backplate. For example, the pins 134 are heat-staked to clamp the bezel 114 to the backplate 132 as shown in FIG. 5C. The user interface PCB 154 is retained, but not compressed, between the bezel 114 and the backplate 132. The actuation member 112 is captured between the bezel 114 and the user interface PCB 154, and the posts 156 extend through the holes 159 of the user interface PCB, such that the posts are operable to contact the touch sensitive device 150 when the actuation member 112 is actuated. The posts 156 do not exert force on the touch sensitive device 150 when the touch sensitive actuator 110 is not being actuated. A distance X between the front surface of the actuation member 112 and the rear surface of the user interface module 130 is approximately 0.298 inch. Further, a distance Y between the front surface 115 of the bezel 114 and the rear surface of the user interface module 130 is approximately 0.178 inch.

Since the bezel 114 is clamped to the backplate 132 with the touch sensitive device 150 compressed between the bezel and the backplate, a distance D between the posts 156 and the touch sensitive device 150 may be minimized while still preventing the posts from undesirably actuating the touch sensitive device 150. The distance D is determined by the tolerances on a distance $D_{112}$ between a surface 112A of the actuation member 112 and the ends of the posts 156, and a distance $D_{114}$ between a surface 114A and a surface 114B of the bezel 114 as shown in FIG. 5C. The tolerances of the touch sensitive device 150 and the user interface PCB 154 do not affect the distance D. Minimizing the distance D provides for an improved aesthetic design and prevents the actuation member 112 from having a loose and sloppy feeling when the touch sensitive actuator 110 is actuated, thus providing a high quality fit, finish, and feel.

The touch sensitive device 150 may comprise, for example, a resistive touch pad. Alternatively, the touch sensitive device 150 may comprise a capacitive touch pad or any other type of touch responsive element, which are well known to those of ordinary skill in the art. The touch sensitive device 150 is coupled to the user interface module PCB 154 via a connector 158. As will be described below in greater detail, the touch sensitive device 150 provides a control signal representative of the position where the touch sensitive device was actuated along the longitudinal axis of the touch sensitive device. A controller 214 (FIG. 12) of the dimmer 100 receives the control signal from the touch sensitive device and controls the lighting load 208 accordingly.

The internal circuitry of the dimmer 100 (i.e., the load control circuitry of FIG. 12) is mounted to a main (or load control) printed circuit board (PCB) 160. The main PCB 160 is held in place between the ring portion 128 and the back portion 129 of the enclosure 126 as shown in FIG. 6. The ring portion 128 defines an opening of the enclosure 126, which is essentially covered by the yoke 122.

Figure 8:
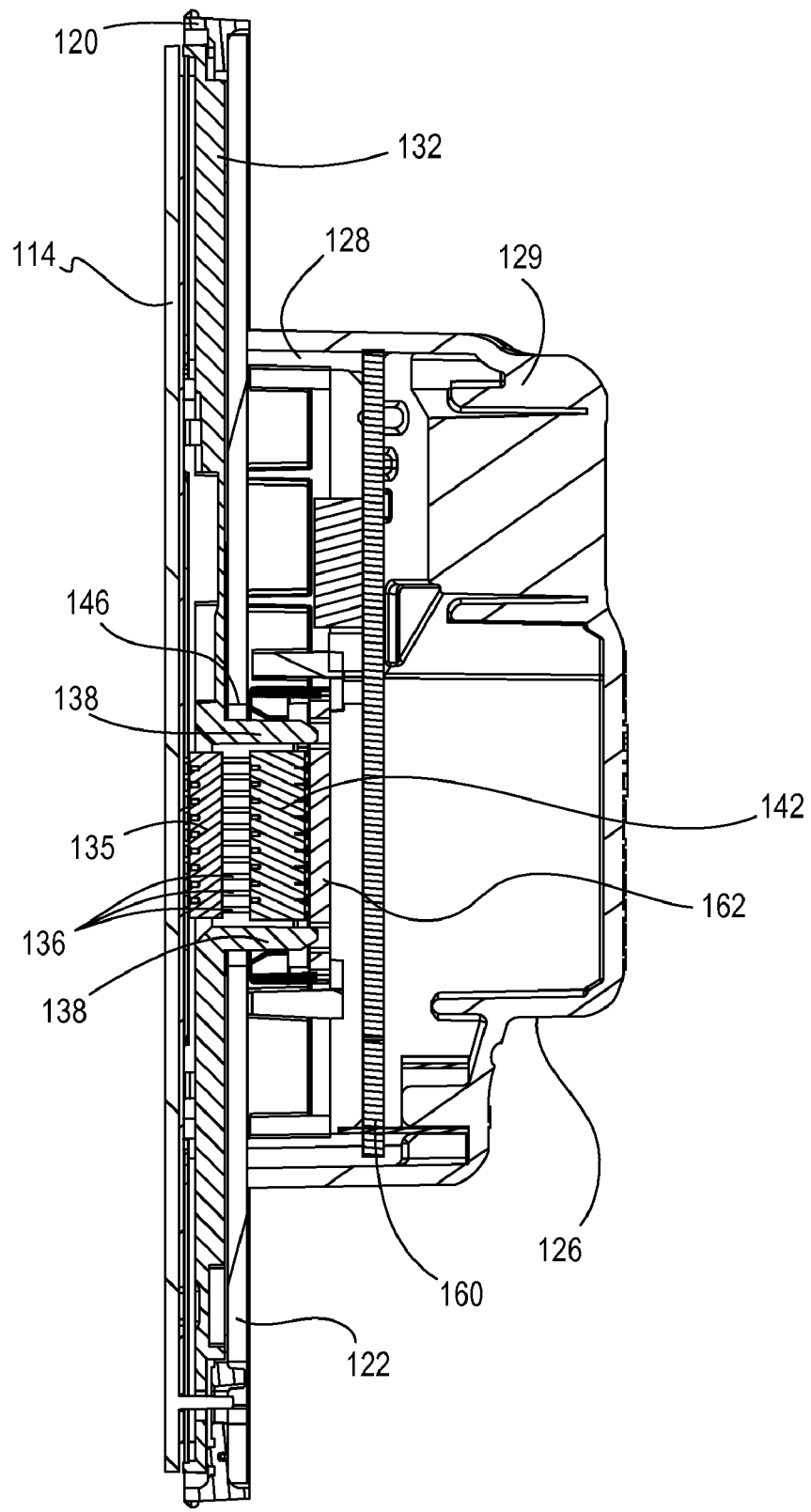
FIG. 8 is another right side cross-sectional view of the dimmer of FIG. 2.
Figure 9:
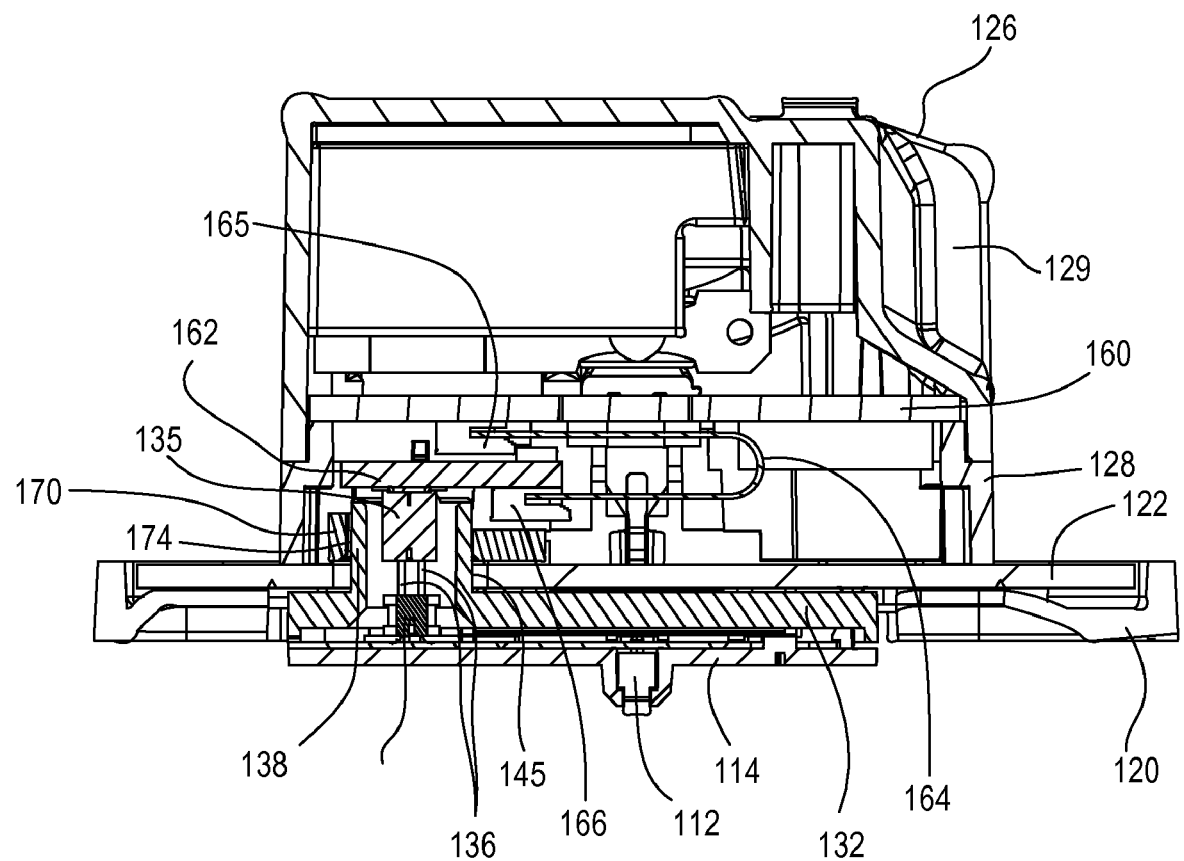
FIG. 9 is a top cross-sectional view of the dimmer of FIG. 2.
Figure 10:
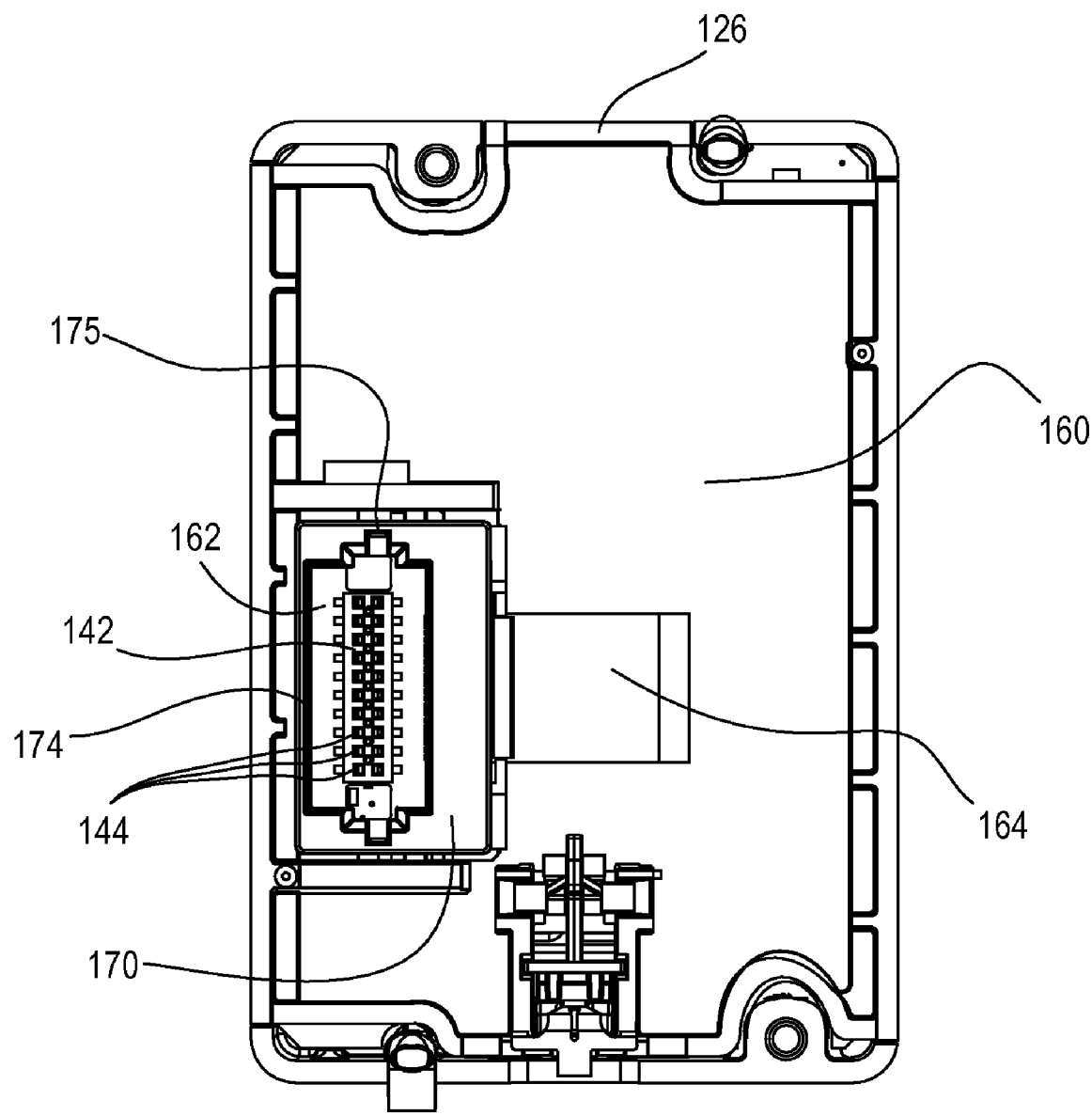
FIG. 10 is a front cross sectional view of the dimmer of FIG. 2.

FIG. 8 is a right side cross-sectional view and FIG. 9 is a top cross-sectional view of the dimmer 100 taken through the middle of the base module connector 142 of the base module 140. FIG. 10 is a front cross sectional view of the dimmer 100 showing the base module connector.

To facilitate the installation of the user interface module 130 on the base module 140, the base module connector 142 is operable to move slightly along a longitudinal axis (i.e., the Y-axis as shown in FIG. 5A) and along a lateral axis (i.e., along the X-axis) of the base module. In other words, the base module connector 142 moves in a plane that is substantially parallel with the plane of the front surface of the faceplate 116 and that is substantially coincident with the plane of the opening of enclosure 126 (i.e., as defined by the ring portion 128). When the user interface module 130 is installed on the base module 140, the freedom of movement of the base module connector 142 allows the touch sensitive actuator 110 to be easily aligned in the opening 118 of the faceplate 116. Therefore, opening 118 of the faceplate 116 can be sized such that there is a minimal distance between the sides of the opening and surface of the touch sensitive actuator 110. This provides a clean, seamless appearance of the dimmer 100.

Figure 11:
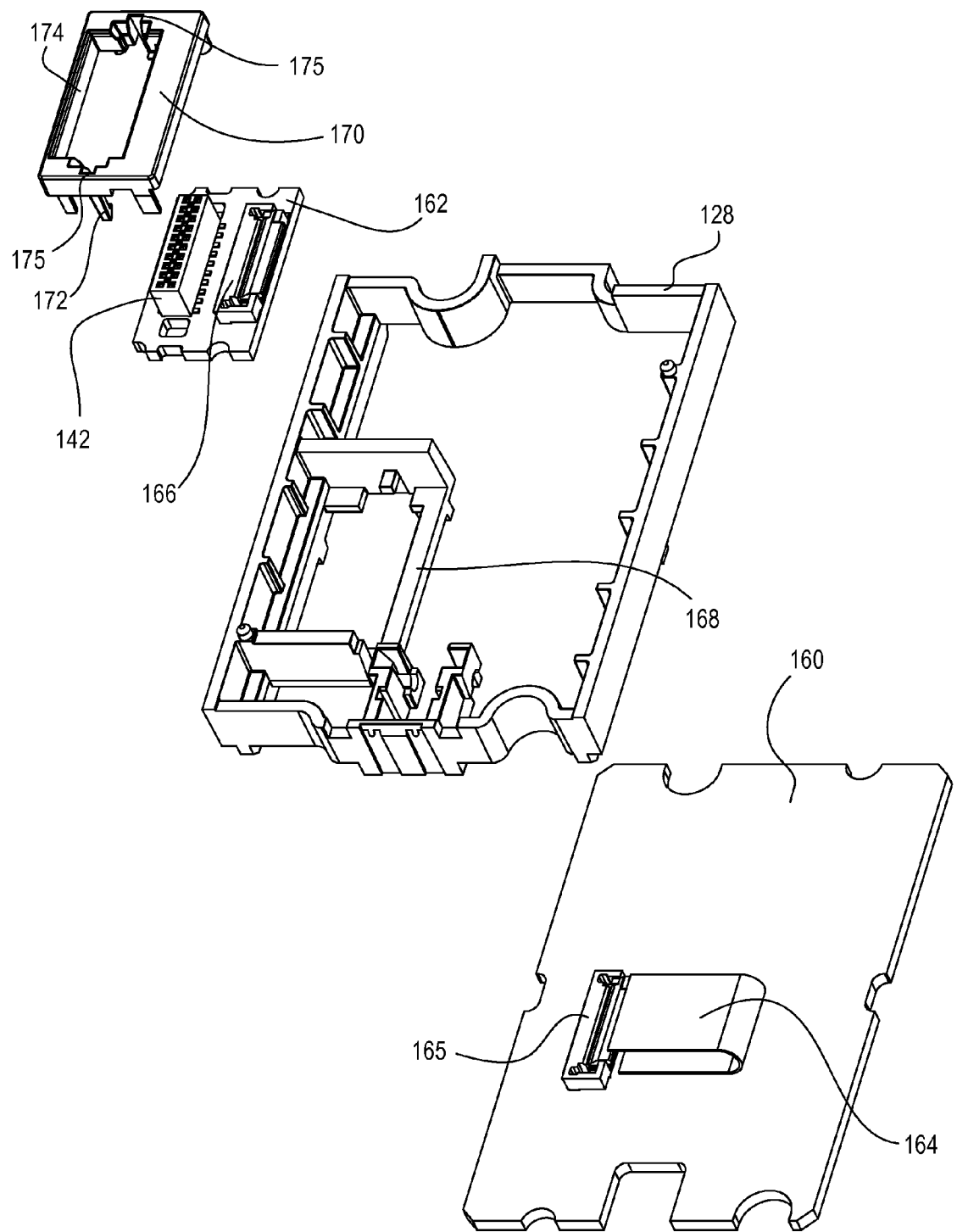
FIG. 11 is an exploded view of the assembly of a flexible base module connector of the base module of FIG. 3.

FIG. 11 is an exploded view of the assembly of the flexible base module connector 142. The base module connector 142 is mounted to a connector PCB 162, which is connected to the main PCB 160 via a flexible ribbon cable 164. Alternatively, other types of flexible connectors may be used. The ribbon cable 164 has a first end connected to a first ribbon connector 165 (e.g., a right-angle ribbon connector) mounted to the main PCB 160 and fixed in location with reference to the enclosure 126. The ribbon cable 164 also has a second end, which is opposite the first end and is connected to a second ribbon connector 166 (e.g., a right-angle ribbon connector) mounted to the connector PCB 162. The ribbon cable 164 wraps around (e.g., in a U-shape, i.e., a 180° bend, as shown in FIGS. 9-11), such that the connector PCB 162 rests on a support rail 168 of the ring portion 128 of the enclosure 126. Accordingly, the connector PCB 162 is slidably captured by the enclosure 126 and is free to translate across the support rail 168 to allow for movement of the base module connector 142 along the longitudinal and lateral axes. Alternatively, the first ribbon connector 165 may comprise a straight ribbon connector and the ribbon cable 164 may curve down in an L-shape (i.e., a 90° bend) from the second ribbon connector 166 to the first ribbon connector.

A frame 170 is provided over the base module connector 142 and connects to the connector PCB 162 via snaps 172. The base module connector 142 is provided through an opening 174 in the frame 170. The opening 174 comprises notches 175 that receive alignment rails 176 of the user interface module connector 135. The notches 175 and the alignment rails 176 help to align the pins 136 of the user interface module connector 135 with the holes 144 of the base module connector 142.

The user interface module 130 of the present invention allows for easily changing the color of the dimmer 100 and the colors of the LEDs 152 after the dimmer 100 is installed. For example, the multiple user interface modules 130 may be available with different colors of the bezel 114 and the LEDs 152. While the dimmer 100 is installed in an electrical wallbox and is powered, the user first removes the presently-installed user interface module 130 having LEDs having a first color (e.g., blue). The user then acquires a new user interface module 130 having LEDs of a different color (e.g., green), and connects the user interface module connector 135 to the base module connector 142 of the base module 140 to energize the LEDs of the user interface.

Figure 12:
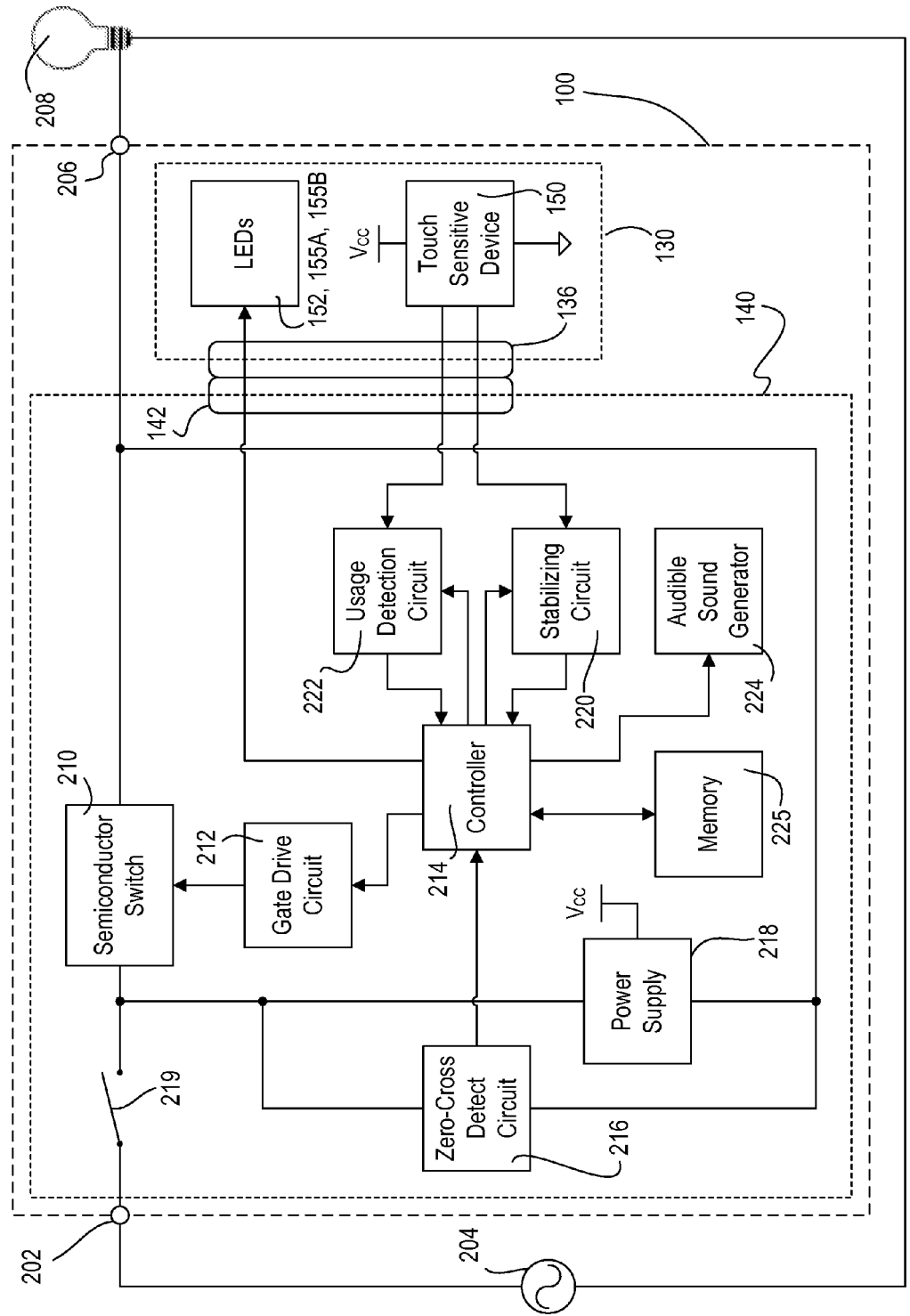
FIG. 12 is a simplified block diagram of the electrical circuitry of the dimmer of FIG. 2.

FIG. 12 is a simplified block diagram of the dimmer 100. The dimmer 100 has a hot terminal 202 connected to an AC voltage source 204 and a dimmed hot terminal 206 connected to a lighting load 208. The user interface module 130 comprises the touch sensitive device 150 and the LEDs 152. The base module comprise a controllably conductive device (e.g., a bidirectional semiconductor switch 210), a gate drive circuit 212, the controller 214, a zero-crossing detect circuit 216, a power supply 218, a stabilizing circuit 220, a usage detection circuit 222, an audible sound generator 224, and a non-volatile memory 225. The user interface module connector 136 connects to the base module connector 142 to electrically connect the user interface module 130 and the base module 140.

The bidirectional semiconductor switch 210 is coupled between the hot terminal 202 and the dimmed hot terminal 206 to control the current through, and thus the intensity of, the lighting load 208. The semiconductor switch 210 has a control input (or gate), which is connected to the gate drive circuit 212. The input to the gate renders the semiconductor switch 210 selectively conductive or non-conductive, which in turn controls the power supplied to the lighting load 208. The gate drive circuit 212 provides a control input to the semiconductor switch 210 in response to a control signal from the controller 214. The controller 214 may be any suitable controller, such as a microcontroller, a microprocessor, a programmable logic device (PLD), or an application specific integrated circuit (ASIC).

The zero-crossing detect circuit 216 determines the zero-crossing points of the AC source voltage from the AC power supply 204. A zero-crossing is defined as the time at which the AC supply voltage transitions from positive to negative polarity, or from negative to positive polarity, at the beginning of each half-cycle. The zero-crossing information is provided as an input to the controller 214. The controller 214 generates the gate control signals to operate the semiconductor switch 210 to thus provide voltage from the AC power supply 204 to the lighting load 208 at predetermined times relative to the zero-crossing points of the AC waveform.

The power supply 218 generates a direct-current (DC) voltage $V_{CC}$, e.g., 5 volts, to power the controller 214 and other low voltage circuitry of the dimmer 100. For example, the power supply 218 may comprise an isolated power supply, such as a flyback switching power supply, and the zero crossing detect circuit 216 and the gate drive circuit 212 include optocouplers, such that the controller 214, the base module connector 142, and the circuitry of the user interface module 130 are electrically isolated from mains voltage, i.e., the AC power source 204.

The touch sensitive device 150 is coupled to the controller 214 through the stabilizing circuit 220 and the usage detection circuit 222. The stabilizing circuit 220 is operable to stabilize the voltage output of the touch sensitive device 150. Accordingly, the voltage output of the stabilizing circuit 220 is not dependent on the magnitude of the force of the point actuation on the touch sensitive device 150, but rather is dependent solely on the position of the point actuation. The usage detection circuit 222 is operable to detect when a user is actuating the touch sensitive actuator 110 of the dimmer 100. The controller 214 is operable to control the operation of the stabilizing circuit 220 and the usage detection circuit 222 and to receive control signals from both the stabilizing circuit and the usage detection circuit. The stabilizing circuit 220 has a slow response time, while the usage detection circuit 222 has a fast response time. Thus, the controller 214 is operable to control the semiconductor switch 210 in response to the control signal provided by the stabilizing circuit 220 when the usage detection circuit 222 has detected an actuation of the touch sensitive device 150.

If the user interface module 130 is disconnected from the base module 140, the controller 214 controls of the semiconductor switch 210 to maintain the intensity of the lighting load 208 at the last level to which the lighting load was controlled. Also, the controller 214 is operable to control the semiconductor switch 210 appropriately in the event of a fault condition (e.g., an overcurrent condition through the semiconductor switch 210 or overvoltage condition across the dimmer 100) when the user interface module 130 is disconnected from the base module 140. Additionally, the user interface module 130 may comprise a communication circuit (not shown) adapted to be coupled to a communication link (e.g., a wired communication link or a wireless communication link, such as a radio-frequency (RF) or infrared (IR) communication link), such that the controller 214 is operable to transmit and receive digital messages via the communication link. Accordingly, the controller 214 may control the semiconductor switch 210 in response to a received digital message even when the user interface module 130 is disconnected from the base module 140.

The controller 214 is operable to drive the LEDs 152 to display a representation of the amount of power being delivered to the lighting load 208. The controller 214 is operable to cause the audible sound generator 224 to produce an audible sound in response to an actuation of the touch sensitive actuator 110.

The memory 225 is coupled to the controller 214 and is operable to store control information of the dimmer 100. The control information of the dimmer may comprise an advanced programming feature, such as a protected preset, or a fade rate. A user of the dimmer 100 may adjust the control information stored in the memory 225 using an advanced programming mode, which is described in greater detail in commonly-assigned U.S. Pat. No. 7,190,125, issued Mar. 13, 2007, entitled PROGRAMMABLE WALLBOX DIMMER, the entire disclosure of which is hereby incorporated by reference. Since the memory 225 is located in the base module 140, the memory 225 is operable to retain the control information if the user interface module 130 is replaced, e.g., to change the colors of the LEDs 152.

The user interface module 130 may also comprise a non-volatile memory (not shown). The memory of the user interface module 130 could store control information specific to the operation of the user interface module, for example, the type of touch sensitive member 150 or the number of LEDs 152. Further, the memory of the user interface module 130 could also store the function of the user interface module, for example, whether the touch sensitive actuator 110 provides dimming functionality (to adjust the intensity of the lighting load 208), switching functionality (to toggle the lighting load on and off), radio-frequency communication functionality, infrared-receiving functionality (to receive wireless remote control signals), timer functionality (to control the lighting load off after a predetermined amount of time), or occupancy sensor functionality (to control the lighting load in response to a space near the dimmer 100 being occupied). The controller 214 could read the memory of the user interface module 130 at startup and then operate with the desired functionality. Alternatively, the user interface module 130 could comprise a passive circuit (not shown), for example, a resistor network, coupled to the controller 214, such that the controller is responsive to the voltage generated across (and thus, the resistance of) the resistors of resistor network. Accordingly, the resistors of the passive circuit could differ in resistance (between user interface modules 130 having different functionalities) depending upon the desired functionality of the user interface module.

Figure 13A:
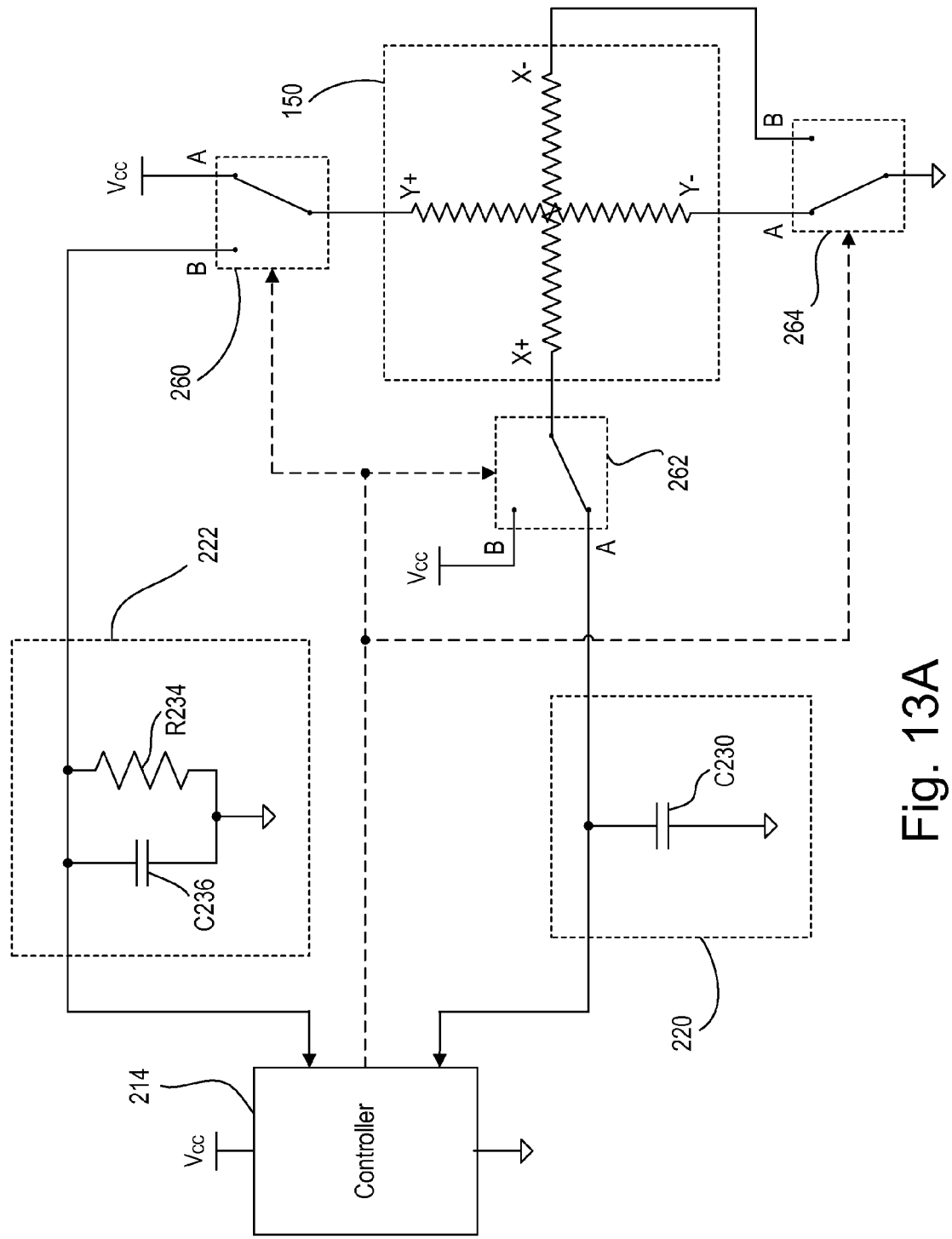
FIG. 13A and FIG. 13B are simplified schematic diagrams of a stabilizing circuit and a usage detection circuit of the electrical circuitry of FIG. 12.
Figure 13B:
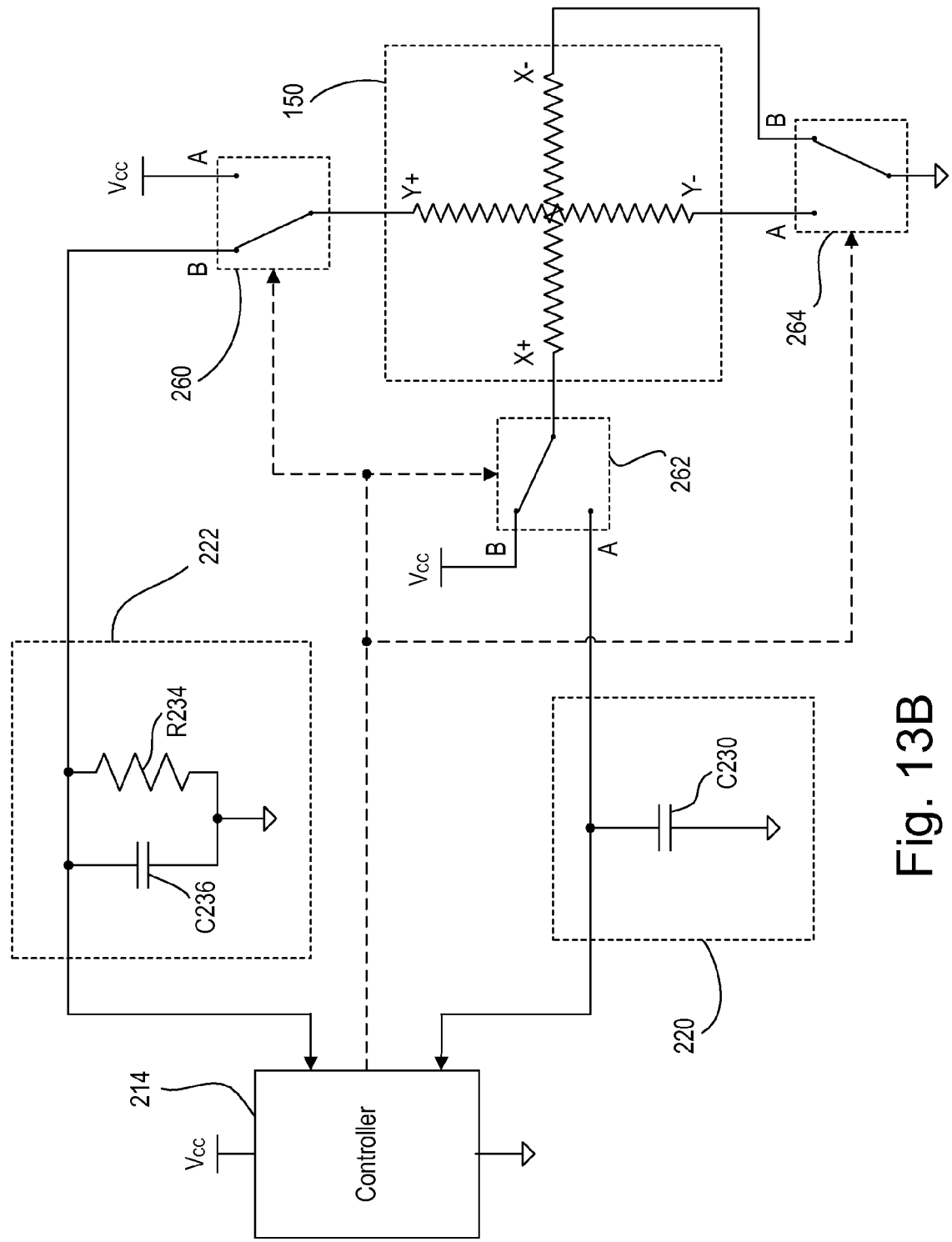

FIG. 13A and FIG. 13B are simplified schematic diagrams of the circuitry between the touch sensitive device 150 and the controller 214, i.e., the stabilizing circuit 220 and the usage detection circuit 222. As shown in FIGS. 13A and 13B, the touch sensitive device 150 has four connections, i.e., electrodes, and provides two outputs: a first output representative of the position of a point actuation along the Y-axis, i.e., the longitudinal axis of the dimmer 100 as shown in FIG. 5B, and a second output representative of the position of the point actuation along the X-axis, i.e., an axis perpendicular to the longitudinal axis. The touch sensitive device 150 provides the outputs depending on how the DC voltage $V_{CC}$ and circuit common are connected to the touch sensitive device. The stabilizing circuit 220 is operatively coupled to the first output and the usage detection circuit 222 is operatively coupled to the second output.

The controller 214 controls three switches 260, 262, 264 to connect the touch sensitive device 150 to the DC voltage $V_{CC}$ and circuit common. When the switches 260, 262, 264 are connected in position A as shown in FIG. 13A, the DC voltage $V_{CC}$ is coupled across the Y-axis resistor, and the X-axis resistor provides the output to the stabilizing circuit 220. When the switches 260, 262, 264 are connected in position B as shown in FIG. 13B, the DC voltage $V_{CC}$ is coupled across the X-axis resistor, and the Y-axis resistor provides the output to the usage detection circuit 222.

The stabilizing circuit 220 comprises a capacitor C230, has a substantially large value of capacitance, e.g., 10 μF. When the switches 260, 262, 264 are connected in position A as shown in FIG. 13A, the capacitor C230 of the stabilizing circuit 220 is coupled to the output of the touch sensitive device 150, such that the output voltage is filtered by the capacitor C230. When a touch is present on the actuation member 112, the voltage on the capacitor C230 will be forced to a steady-state voltage representing the position of the touch on the actuation member 112. When no touch is present, the voltage on the capacitor will remain at a voltage representing the position of the last touch. When a light or transient press is applied to the touch sensitive device 150, the capacitor C230 will continue to hold the output at the voltage representing the position of the last touch. The output of the stabilizing circuit 220 is representative of only the position of the point of actuation of the touch sensitive device 150.

The usage detection circuit 222 comprises a resistor R234 and a capacitor C236. When the switches 260, 262, 264 are connected in position B as shown in FIG. 13B, the parallel combination of the resistor R234 and the capacitor C236 is coupled to the output of the touch sensitive device 150. The capacitor C236 may have a substantially small capacitance $C_{236}$, such that the capacitor C236 charges substantially quickly in response to all point actuations on the touch sensitive actuator 110. The resistor R234 allows the capacitor C236 to discharge quickly when the switch 260 is in position A. Therefore, the output of the usage detection circuit 222 is representative of the instantaneous usage of the touch sensitive device 150.

The controller 214 controls the switches 260, 262, 264 to position B for a short period of time $t_{USAGE}$ once every half-cycle of the voltage source 204 to determine whether the user is actuating the touch sensitive actuator 110. For example, the short period of time $t_{USAGE}$ may be approximately 100 μsec or 1% of the half-cycle (assuming each half-cycle is 8.33 msec long). For the remainder of the time, the switches 260, 262, 264 are in position A, such that the capacitor C230 is operable to charge to a voltage representing the position of the touch on the actuation member 112 when the touch sensitive device 110 is presently being actuated. When the switches 260, 262, 264 are in position B, the controller 214 determines whether the touch sensitive device 150 is presently being actuated using the usage detection circuit 222, and the capacitor C230 of the stabilizing circuit 220 is unable to discharge at a significant rate, such that the voltage developed across the capacitor C230 does not change significantly. The operation of the stabilizing circuit 220, the usage detection circuit 222, and the switches 260, 262, 264 is described in greater detail in co-pending, commonly-assigned U.S. patent application Ser. No. 11/471,914, filed Jun. 20, 2006, entitled FORCE INVARIANT TOUCH SCREEN, the entire disclosure of which is hereby incorporated by reference.

Figure 14:
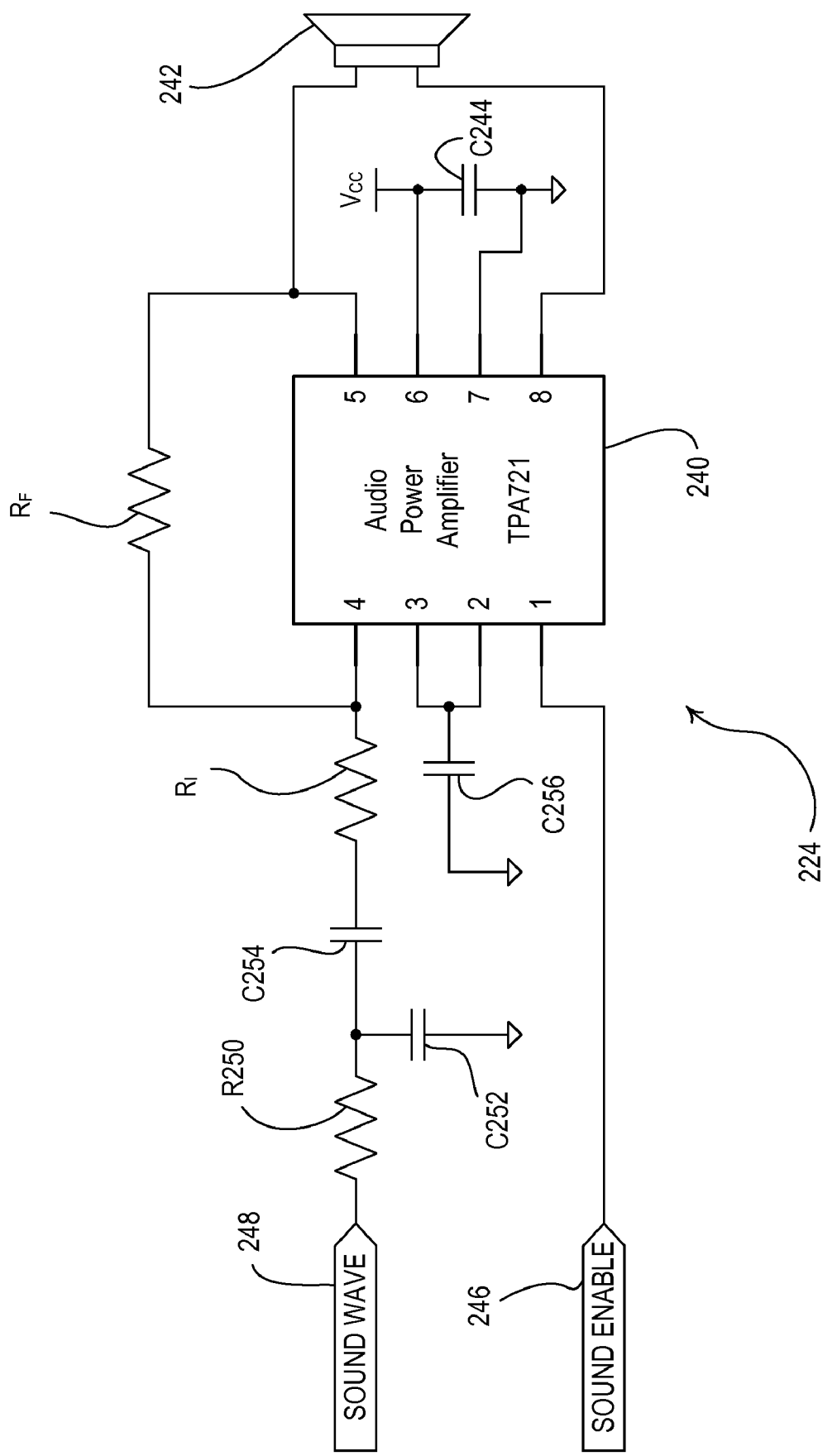
FIG. 14 is a simplified schematic diagram of an audible sound generator of the electrical circuitry of FIG. 12.

FIG. 14 is a simplified schematic diagram of the audible sound generator 224 of the dimmer 100. The audible sound generator 224 uses an audio power amplifier integrated circuit (IC) 240, for example, part number TPA721 manufactured by Texas Instruments, Inc., to generate a sound from a piezoelectric or magnetic speaker 242. The amplifier IC 240 is coupled to the DC voltage $V_{CC}$ (pin 6) and circuit common (pin 7) to power the amplifier IC. A capacitor C244 (e.g., having a capacitance of 0.1 µF) is coupled between the DC voltage $V_{CC}$ and circuit common to decouple the power supply voltage and to ensure the output total harmonic distortion (THD) is as low as possible.

The audible sound generator 224 receives a SOUND ENABLE signal 246 from the controller 214. The SOUND ENABLE signal 246 is provided to an enable pin (i.e., pin 1) on the amplifier IC 240, such that the audible sound generator 224 will be operable to generate the sound when the SOUND ENABLE signal is at a logic high level.

The audible sound generator 224 further receives a SOUND WAVE signal 248 from the controller 214. The SOUND WAVE signal 248 is an audio signal that is amplified by the amplifier IC 240 to generate the appropriate sound at the speaker 242. The SOUND WAVE signal 248 is first filtered by a low-pass filter comprising a resistor R250 and a capacitor C252. For example, the resistor R250 has a resistance of 1 kΩ and the capacitor C252 has a capacitance of 0.1 nF. The filtered signal is then passed through a capacitor C254 to produce an input signal $V_{IN}$. The capacitor C254 allows the amplifier IC to bias the input signal $V_{IN}$ to the proper DC level for optimum operation and has, for example, a capacitance of 0.1° F. The input signal $V_{IN}$ is provided to a negative input (pin 4) of the amplifier IC 240 through a input resistor R1. A positive input (pin 3) of the amplifier IC 240 and a bypass pin (pin 2) are coupled to circuit common through a bypass capacitor C256 (e.g., having a capacitance of 0.1 µF).

The output signal $V_{OUT}$ of the amplifier IC 240 is produced from a positive output (pin 5) to a negative output (pin 8) and is provided to the speaker 242. The negative input (pin 4) is coupled to the positive output (pin 5) through an output resistor $R_F$. The gain of the amplifier IC 240 is set by the input resistor $R_I$ and the feedback resistor $R_F$, i.e., $$\text{Gain} = V_{OUT}/V_{IN} = -2 \cdot (R_F/R_I).$$

For example, the input resistor R1 and the output resistor RF both have resistances of 10 kΩ, such that the gain of the amplifier IC 240 is negative two (−2).

Figure 15:
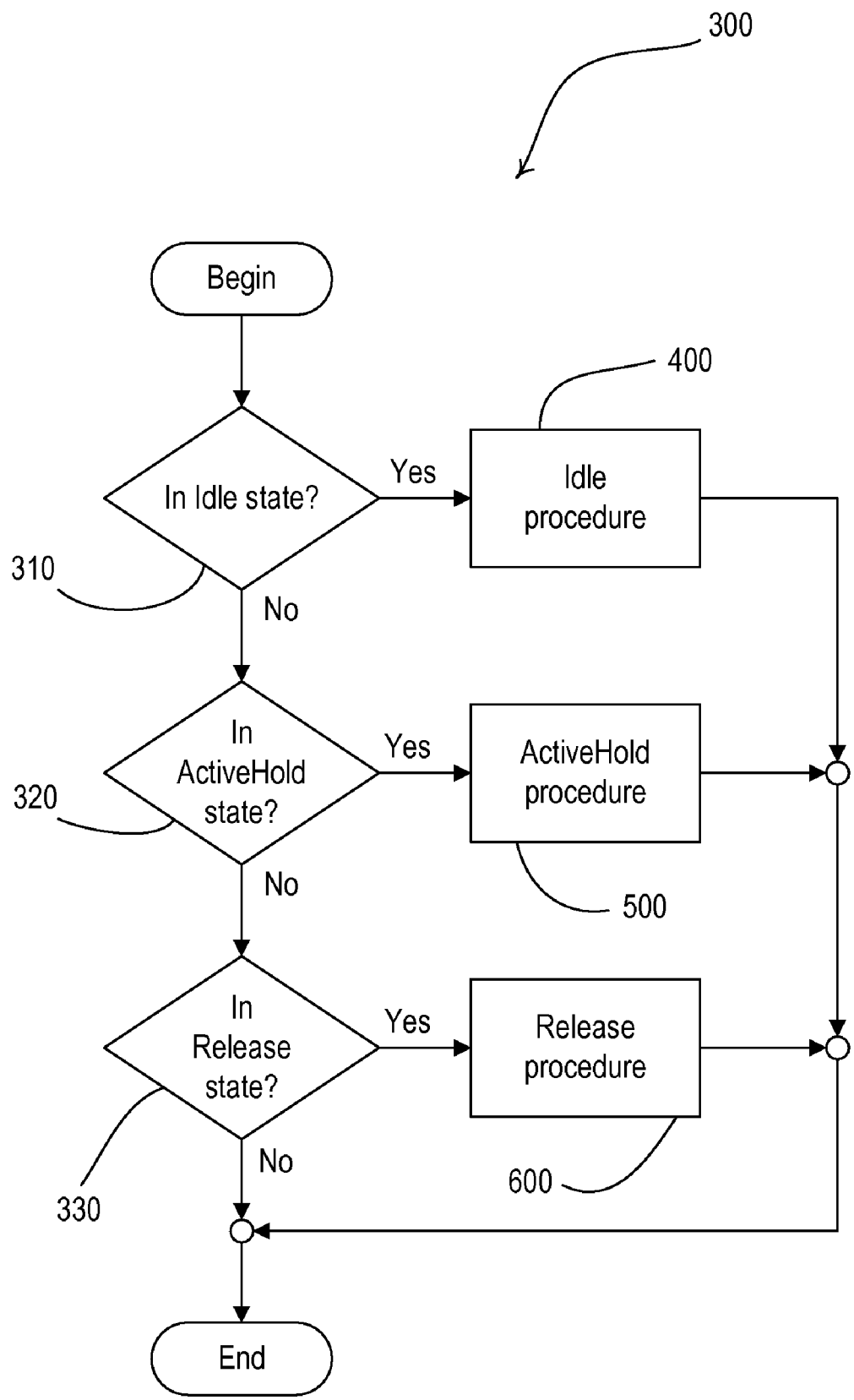
FIG. 15 is a flowchart of a actuation procedure executed by a controller of the dimmer of the electrical circuitry of FIG. 12.

FIG. 15 is a flowchart of an actuation procedure 300 executed by the controller 214 of the dimmer 100 according to the present invention. The actuation procedure 300 is called from the main loop of the software of the controller 214, for example, once every half-cycle of the AC voltage source 204.

The actuation procedure 300 selectively executes one of three procedures depending upon the state of the dimmer 100. If the dimmer 100 is in an "Idle" state (i.e., the user is not actuating the touch sensitive device 150) at step 310, the controller 214 executes an Idle procedure 400. If the dimmer 100 is in an "ActiveHold" state (i.e., the user is presently actuating the touch sensitive device 150) at step 320, the controller 214 executes an ActiveHold procedure 500. If the dimmer 100 is in a "Release" state (i.e., the user has recently ceased actuating the touch sensitive device 150) at step 330, the controller 214 executes a Release procedure 600.

Figure 16:
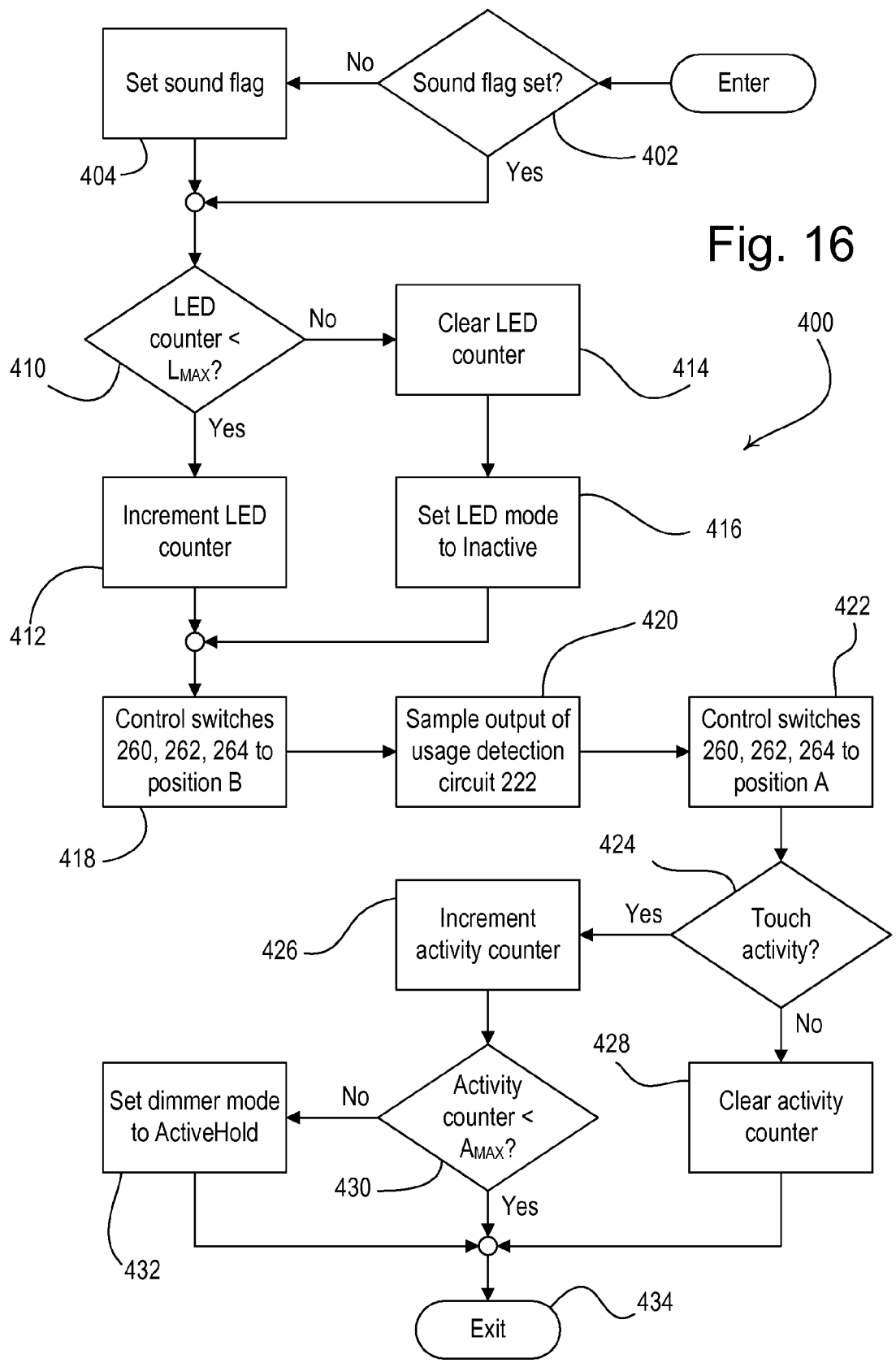
FIG. 16 is a flowchart of an Idle procedure of the actuation procedure of FIG. 15.

FIG. 16 is a flowchart of the Idle procedure 400 according to the present invention. The controller 114 uses a "sound flag" and a "sound counter" to determine when to cause the audible sound generator 224 to generate the audible sound. The purpose of the sound flag is to cause the sound to be generated the first time that the controller 214 executes the ActiveHold procedure 500 after being in the Idle state. If the sound flag is set, the controller 214 will cause the sound to be generated. The sound counter is used to ensure that the controller 214 does not cause the audible sound generator 224 to generate the audible sound too often. The sound counter has a maximum sound counter value $S_{MAX}$, e.g., approximately 425 msec. Accordingly, there is a gap of approximately 425 msec between generations of the audible sound. The sound counter is started during the Release procedure 600 as will be described in greater detail below. Referring to FIG. 16, upon entering the Idle state, the controller 214 sets the sound flag at step 404 if the sound flag is not set at step 402.

An "LED counter" and an "LED mode" are used by the controller 214 to control the visual indicators 114 (i.e., the LEDs 152) of the dimmer 100. The controller 214 uses the LED counter to determine when a predetermined time $t_{LED}$ has expired since the touch sensitive device 150 was actuated. When the predetermined time $t_{LED}$ has expired, the controller 214 will change the LED mode from "active" to "inactive". When the LED mode is "active", the visual indicators 114 are controlled such that one or more of the visual indicators are illuminated to a bright level. When the predetermined time $t_{LED}$ expires, the LED mode is changed to "inactive", i.e., the visual indicators 114 are controlled such that one or more of the visual indicators are illuminated to a dim level. Referring to FIG. 16, if the LED counter is less than a maximum LED counter value $L_{MAX}$ at step 410, the LED counter is incremented at step 412 and the process moves on to step 418. However, if the LED counter is not less than the maximum LED counter value $L_{MAX}$, the LED counter is cleared at step 414 and the LED mode is set to inactive at step 416. Since the actuation procedure 300 is executed once every half-cycle, the predetermined time $t_{LED}$ is equal to $$t_{LED} = T_{HALF} \cdot L_{MAX},$$

where $T_{HALF}$ is the period of a half-cycle.

Next, the controller 214 samples the output of the usage detection circuit 222 to determine if the touch sensitive device 150 is being actuated. For example, the usage detection circuit 222 may be monitored once every half-cycle of the voltage source 204. At step 418, the controller 214 controls the switches 260, 262, 264 to position B to couple the resistor R234 and the capacitor C236 to the output of the touch sensitive device 150. The controller 214 samples the DC voltage of the output of the usage detection circuit 222 at step 420 by using, for example, an analog-to-digital converter (ADC). Next, the controller 214 controls the switches 260, 262, 264 to position A at step 422.

At step 424, if there is activity on the touch sensitive actuator 110 of the dimmer 100, i.e., if the DC voltage sampled at step 420 is above a predetermined minimum voltage threshold, then an "activity counter" is incremented at step 426. Otherwise, the activity counter is cleared at step 428. The activity counter is used by the controller 214 to determine if the DC voltage determined at step 420 is the result of a point actuation of the touch sensitive device 150 rather than noise or some other undesired impulse. The use of the activity counter is similar to a software "debouncing" procedure for a mechanical switch, which is well known to one having ordinary skill in the art. If the activity counter is not less than a maximum activity counter value $A_{MAX}$ at step 430, then the dimmer state is set to the ActiveHold state at step 432. Otherwise, the process simply exits at step 434.

Figure 17A:
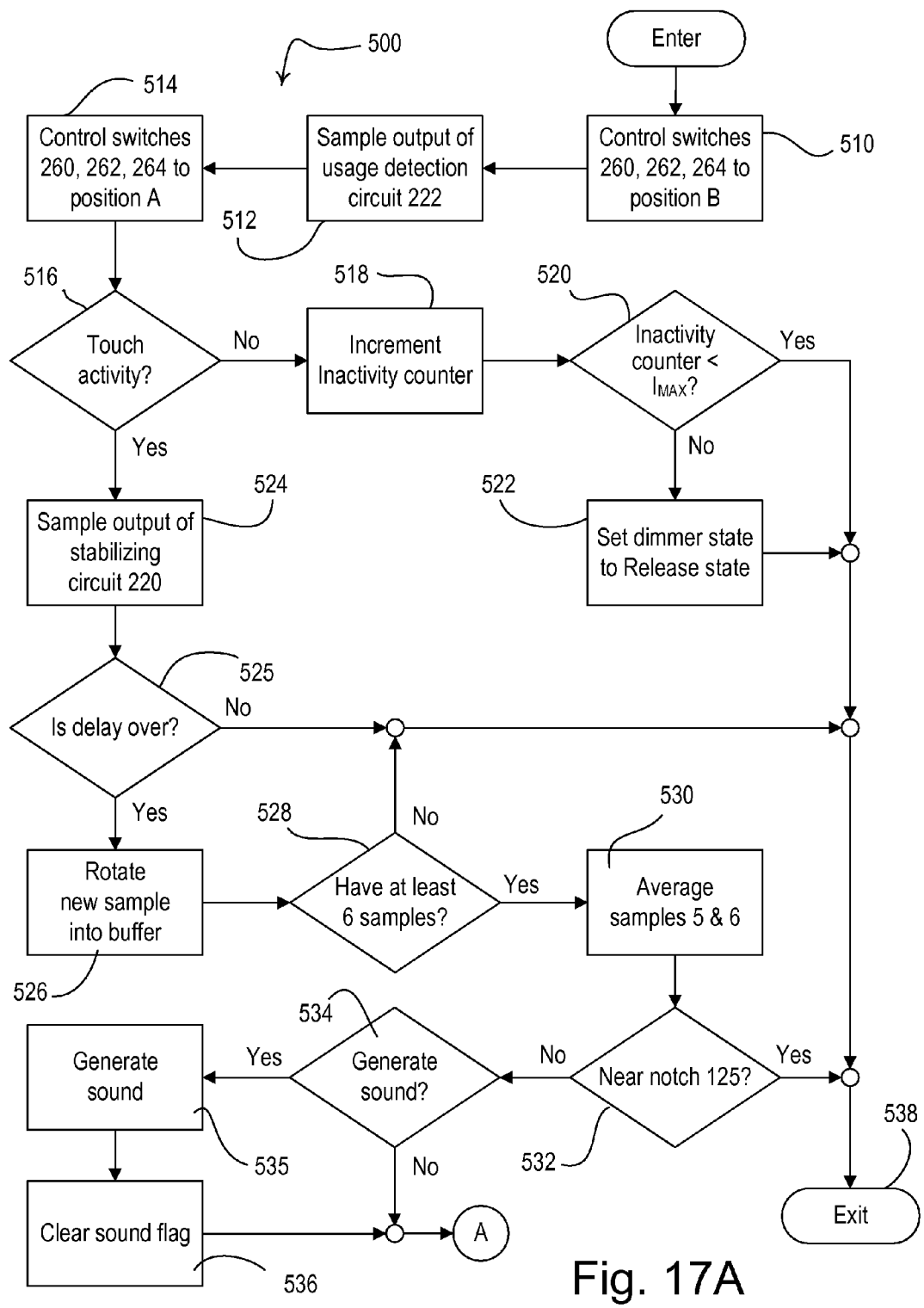
FIGS. 17A and 17B are flowcharts of an ActiveHold procedure of the actuation procedure of FIG. 15.
Figure 17B:
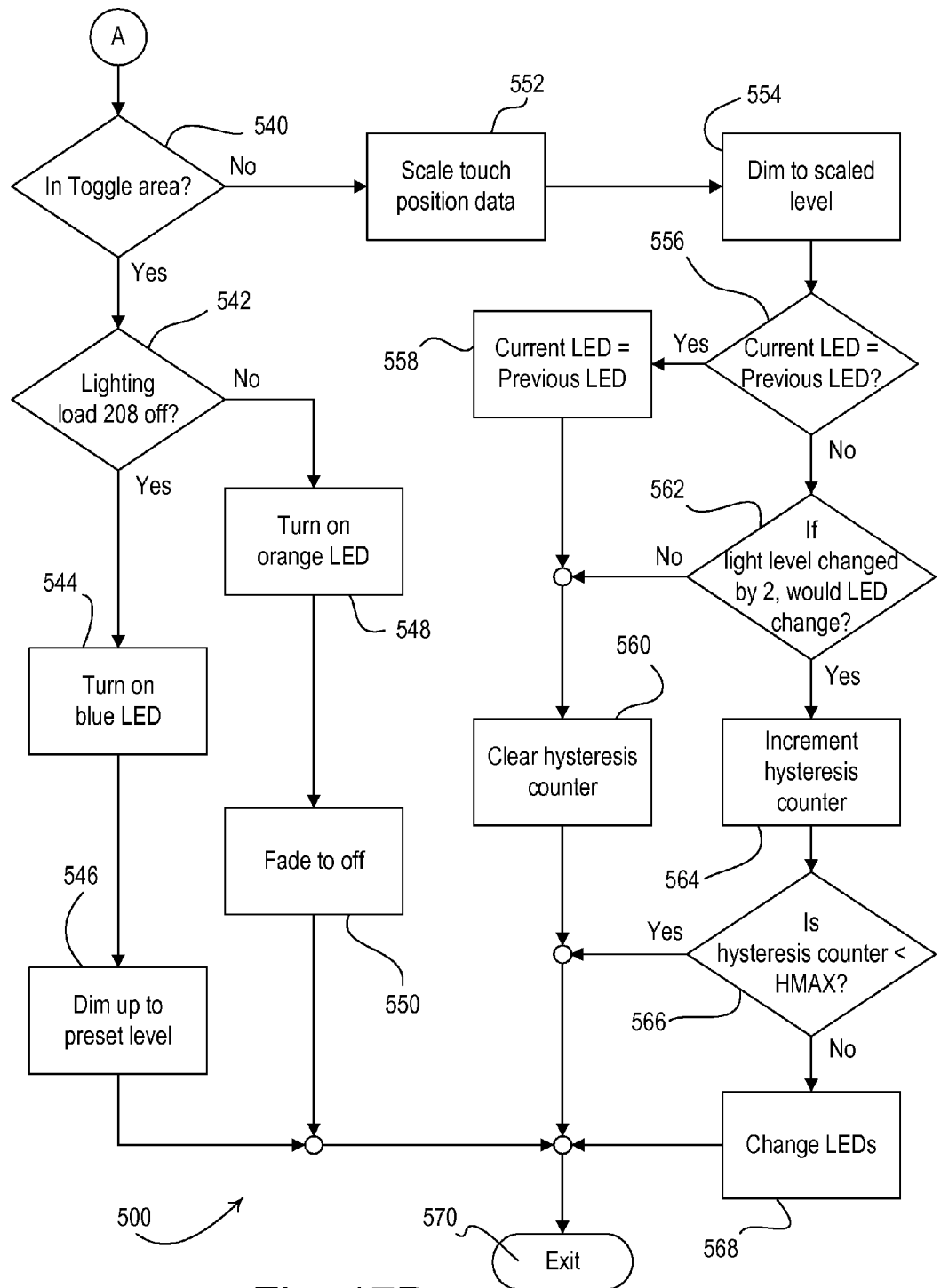

FIGS. 17A and 17B are flowcharts of the ActiveHold procedure 500, which is executed once every half-cycle when the touch sensitive device 150 is being actuated, i.e., when the dimmer 100 is in the ActiveHold state. First, a determination is made as to whether the user has stopped using, i.e., released, the touch sensitive device 150. The controller 214 controls the switches 260, 262, 264 to position B at step 510, and samples the output of the usage detection circuit 222 at step 512. At step 514, the controller 214 controls the switches 260, 262, 264 to position A. If there is no activity on the touch sensitive actuator 110 of the dimmer 100 at step 516, the controller 214 increments an "inactivity counter" at step 518. The controller 214 uses the inactivity counter to make sure that the user is not still actuating the touch sensitive device 150 before entering the Release mode. If the inactivity counter is less than a maximum inactivity counter value IMAX at step 520, the process exits at step 538. Otherwise, the dimmer state is set to the Release state at step 522, and then the process exits.

If there is activity on the touch sensitive device 150 at step 516, the controller 214 samples the output of the stabilizing circuit 220, which is representative of the position of the point actuation on the touch sensitive actuator 110 of the dimmer 100. Since the switches 260, 262, 264 are in position A, the controller 214 determines the DC voltage at the output of the stabilizing circuit 220 at step 524 using, for example, the analog-to-digital converter.

Next, the controller 214 uses a buffer to "filter" the output of stabilizing circuit 220. When a user actuates the touch sensitive device 150, the capacitor C230 will charge across a period of time sampled by the first time constant $\tau_1$ to approximately the steady-state voltage representing the position of the point actuation on the actuation member 112 as previously described. Since the voltage across the capacitor C230, i.e., the output of the stabilizing circuit 220, is increasing during this time, the controller 214 delays for a predetermined period of time at step 525, e.g., for approximately three (3) half-cycles.

When a user's finger is removed from the actuation member 112, subtle changes in the force and position of the point actuation occur, i.e., a "finger roll-off" event occurs. Accordingly, the output signal of the touch sensitive device 150 is no longer representative of the position of the point actuation. To prevent the controller 214 from processing samples during a finger roll-off event, the controller 214 saves the samples in the buffer and processes the samples with a delay, e.g., six half-cycles later. Specifically, when the delay is over at step 525, the controller 214 rotates the new sample (i.e., from step 524) into the buffer at step 526. If the buffer has at least six samples at step 528, the controller 214 averages the samples in the fifth and sixth positions in the buffer at step 530 to produce the touch position data. In this way, when the user stops actuating the touch sensitive device 150, the controller 214 detects this change at step 516 and sets the dimmer state to the Release state at step 522 before the controller processes the samples saved in the buffer near the transition time of the touch sensitive device.

At step 532, the controller 114 determines if the touch position data from step 530 is in a keepout region, i.e., near the notch 125. If the touch position data is in the keepout region, the ActiveHold procedure 500 simply exits at step 538. Otherwise, a determination is made at step 534 as to whether the sound should be generated. Specifically, if the sound flag is set and if the sound counter has reached a maximum sound counter value $S_{MAX}$, the controller 214 drives the SOUND ENABLE signal 246 high and provides the SOUND WAVE signal 248 to the audible sound generator 224 to generate the sound at step 535. Further, the sound flag is cleared at step 536 such that the sound will not be generated as long as the dimmer 100 remains in the ActiveHold state.

If the touch position data is in the toggle area, i.e., the lower portion 112B of the actuation member 112, at step 540, the controller 214 processes the actuation of the touch sensitive device 150 as a toggle. If the lighting load 208 is presently off at step 542, the controller 214 turns the lighting load on. Specifically, the controller 214 illuminates the lower portion 112B of the actuation member 112 with the blue LED 155A at step 544 and dims the lighting load 208 up to the preset level, i.e., the desired lighting intensity of the lighting load, at step 546. If the lighting load is presently on at step 542, the controller 214 turns on the orange LED 155B at step 548 and fades the lighting load 208 to off at step 550.

If the touch position data is not in the toggle area at step 540, the controller 214 scales the touch position data, i.e., the sample of the output of the stabilizing circuit 220, at step 552. The output of the stabilizing circuit 220 is a DC voltage between a maximum value, e.g., substantially the DC voltage $V_{CC}$, and a minimum value, which corresponds to the DC voltage provided by the touch sensitive device 150 when a user is actuating the lower end of the upper portion 112A of the actuation member 112. The controller 214 scales this DC voltage to be a value between off (i.e., 1%) and full intensity (i.e., 100%) of the lighting load 208. At step 554, the controller 214 dims the lighting load 208 to the scaled level produced in step 552.

Next, the controller 214 changes the LEDs 152 located behind the actuation member 112. As a user actuates the touch sensitive device 150 to change intensity of the lighting load 208, the controller 214 decides whether to change the LED 152 that is presently illuminated. For example, the controller 214 may use hysteresis to control the LEDs 152 such that if the user actuates the upper portion 112A of the actuation member 112 at a boundary between two of the regions of intensities described above, consecutive visual indicators do not toggle back and forth.

Referring to FIG. 17B, a determination is made as to whether a change is needed as to which LED 152 is illuminated at step 556. If the present LED 152 (in result to the touch position data from step 530) is the same as the previous LED, then no change in the LED is required. The present LED 152 is set the same as the previous LED at step 558, a hysteresis counter is cleared at step 560, and the process exits at step 570.

If the present LED 152 is not the same as the previous LED at step 556, the controller 214 determines if the LED should be changed. Specifically, at step 562, the controller 214 determines if present LED 152 would change if the light level changed by 2% from the light level indicated by the touch position data. If not, the hysteresis counter is cleared at step 560 and the process exits at step 570. Otherwise, the hysteresis counter is incremented at step 564. If the hysteresis counter is less than a maximum hysteresis counter value $H_{MAX}$ at step 566, the process exits at step 570. Otherwise, the LEDs 152 are changed accordingly based on the last sample of the output of the stabilizing circuit 220 at step 568.

Figure 18:
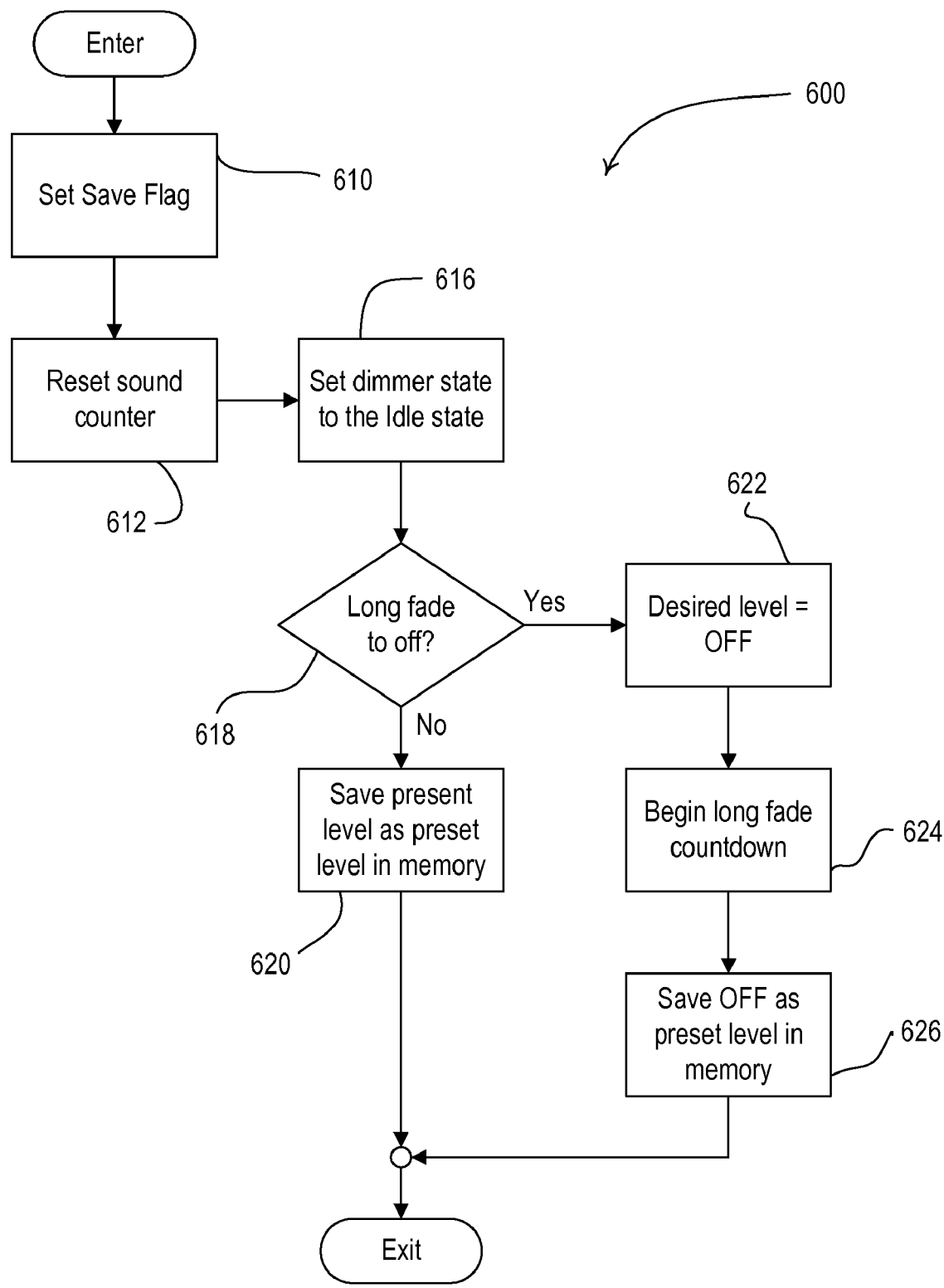
FIG. 18 is a flowchart of a Release procedure of the actuation procedure of FIG. 15.

FIG. 18 is a flowchart of the Release procedure 600, which is executed after the controller 214 sets the dimmer state to the Release state at step 522 of the ActiveHold procedure 500. First, a save flag is set at step 610. Next, the sound counter is reset at step 612 to ensure that the sound will not be generated again, e.g., for 18 half-cycles. At step 618, a determination is made as to whether the dimmer 100 is presently executing a fade-to-off. If not, the present level is saved as the preset level in the memory 225 at step 620. Otherwise, the desired lighting intensity is set to off at step 622, the long fade countdown in started at step 624, and the preset level is saved as off in the memory 225 at step 626.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A load control device for controlling the amount of power delivered from an AC power source to an electrical load, the load control device comprising:
   a user interface module comprising a first connector; and
   a base module comprising a controllably conductive device adapted to be coupled in series electrical connection between the AC power source and the electrical load, a controller for controlling the controllably conductive device to control the amount of power delivered to the electrical load, and a second connector adapted to be coupled to the first connector of the user interface module, the base module further comprising:
   a main printed circuit board, the controllably conductive device and the controller electrically connected to the main printed circuit board;
   a connector printed circuit board, the second connector mounted to the connector printed circuit board; and
   a cable electrically connecting the main printed circuit board and the connector printed circuit board;
   wherein the second connector of the base module is adapted to move along both the longitudinal axis and the lateral axis of the load control device to allow for alignment of the user interface module on the base module.

2. The load control device of claim 1, wherein the first connector of the user interface module comprises a plurality of pins and the second connector of the base module comprises a plurality of holes for receipt of the plurality of pins of the first connector, such that the user interface module is electrically connected to the base module when the first connector is coupled to the second connector.

3. The load control device of claim 1, further comprising:
   an enclosure, the main printed circuit board fixedly mounted to an interior of the enclosure, the connector printed circuit board slidably captured by the enclosure.

4. The load control device of claim 1, wherein the cable comprises a ribbon cable.

5. The load control device of claim 1, wherein the user interface module comprises an actuator operable to receive a user input, the controller responsive to the actuator when the first connector is coupled to the second connector.

6. The load control device of claim 2, further comprising:
   a frame having an opening and connected to the connector printed circuit board, the first connector of the user interface module received through the opening of the frame to connect to the second connector of the base module.

7. The load control device of claim 6, wherein the plurality of pins of the first connector are surrounded by walls, the walls defining alignment rails adapted to be received in notches of the opening of the frame.

8. The load control device of claim 3, wherein the enclosure comprises a support rail, the connector printed circuit board adapted to slide across the support rail of the enclosure.

9. The load control device of claim 5, wherein the actuator comprises a touch sensitive actuator having an actuation member operable to contact a touch sensitive device.

10. The load control device of claim 5, wherein the user interface module comprises a visual display for displaying a representation of an amount of power being delivered to the electrical load, the controller operatively coupled to the visual display when the first connector is coupled to the second connector.

11. A load control device for controlling the amount of power delivered from an AC power source to an electrical load, the load control device comprising:
   a user interface module comprising a first connector, an actuator operable to receive a user input, and a visual display for displaying a representation of an amount of power being delivered to the electrical load; and
   a base module comprising a controllably conductive device adapted to be coupled in series electrical connection between the AC power source and the electrical load, and a controller for controlling the controllably conductive device to control the amount of power delivered to the electrical load, the base module further comprising a second connector adapted to be coupled to the first connector of the user interface module, the controller responsive to the actuator and operatively coupled to the visual display when the first connector is coupled to the second connector;
   wherein the second connector is adapted to move along both a longitudinal axis and a lateral axis of the load control device to align the user interface module on the base module.

12. The load control device of claim 11, wherein the actuator comprises a touch sensitive actuator having an actuation member operable to contact a touch sensitive device.

13. The load control device of claim 11, wherein the base module further comprises:
   a main printed circuit board, the controllably conductive device and the controller electrically connected to the main printed circuit board;
   a connector printed circuit board, the second connector mounted to the connector printed circuit board; and
   a cable electrically connecting the main printed circuit board and the connector printed circuit board, such the connector printed circuit board is operable to move along the longitudinal axis and the lateral axis of the load control device.

14. A load control device for controlling the amount of power delivered from an AC power source to an electrical load, the load control device comprising:
   a user interface module comprising a first connector and an actuator operable to receive a user input;
   a base module comprising a second connector adapted to be coupled to the first connector of the user interface module, the second connector adapted to move along a longitudinal axis and a lateral axis of the load control device to align the user interface module on the base module; and a faceplate having an opening, the actuator of the user interface module adapted to be provided in the opening of the faceplate;

wherein the second connector is adapted to move along the longitudinal axis and the lateral axis of the load control device to align the actuator within the opening of the faceplate.

15. The load control device of claim 14, wherein the user interface module comprises a post and the base module comprises an opening adapted to receive the post, so as to allow for alignment of the user interface module and the base module.

16. The load control device of claim 14, wherein the base module comprises a controllably conductive device adapted to be coupled in series electrical connection between the electrical load and the AC power source, and a controller for controlling the controllably conductive device to control the amount of power delivered to the electrical load.

17. The load control device of claim 16, wherein the controller is responsive to the actuator when the first connector is coupled to the second connector.

18. The load control device of claim 16, wherein the base module further comprises:

a main printed circuit board, the controllably conductive device and the controller electrically connected to the main printed circuit board;

a connector printed circuit board, the second connector mounted to the connector printed circuit board; and a cable electrically connecting the main printed circuit board and the connector printed circuit board, such the connector printed circuit board is operable to move along the longitudinal axis and the lateral axis of the load control device.

19. The load control device of claim 17, wherein the actuator comprises a touch sensitive actuator having an actuation member operable to contact a touch sensitive device.

20. The load control device of claim 17, wherein the user interface module comprises a visual display for displaying a representation of an amount of power being delivered to the electrical load, the controller operatively coupled to the visual display when the first connector is coupled to the second connector.

21. A load control device for controlling the amount of power delivered to an electrical load from an AC power source, the load control device comprising:

a user interface module comprising a first connector and an actuator operable to receive a user input;

a base module having a front surface defining a plane, the base module comprising a second connector adapted to be coupled to the first connector of the user interface module; and a faceplate having an opening, the actuator of the user interface module adapted to be provided in the opening of the faceplate;

wherein the second connector is adapted to move in a plane substantially parallel to the plane of the front surface to allow for alignment of the actuator of the user interface module within the opening of the faceplate.

* * * * *